(12) United States Patent
Kawano et al.

(10) Patent No.: US 6,258,167 B1
(45) Date of Patent: Jul. 10, 2001

(54) PROCESS LIQUID FILM FORMING APPARATUS

(75) Inventors: Yukihiro Kawano, Suita; Takashi Takekuma, Yamaga, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/334,272

(22) Filed: Jun. 16, 1999

Related U.S. Application Data

(63) Continuation-in-part of application No. 08/979,781, filed on Nov. 26, 1997, now Pat. No. 5,976,256.

(30) Foreign Application Priority Data

Nov. 27, 1996 (JP) .................................................... 8-331663
Feb. 8, 1999 (JP) .................................................. 11-030468

(51) Int. Cl.$^7$ ........................................................ B05C 5/02
(52) U.S. Cl. .................. 118/667; 118/679; 118/683; 118/684; 118/686; 118/302; 118/323; 118/410; 118/52
(58) Field of Search .................................. 118/666, 667, 118/679, 683, 684, 686, 302, 323, 410, 52, 50; 427/240; 425/378.1, 144

(56) References Cited

U.S. PATENT DOCUMENTS

| | | |
|---|---|---|
| 4,622,239 * | 11/1986 | Schoenthaler et al. ................. 427/96 |
| 4,675,230 | 6/1987 | Innes . |
| 4,692,351 * | 9/1987 | Maeda et al. ......................... 118/410 |
| 4,732,776 | 3/1988 | Boissevain . |
| 5,127,362 * | 7/1992 | Iwatsu et al. ......................... 118/667 |
| 5,209,954 | 5/1993 | Takahashi et al. . |
| 5,335,681 | 8/1994 | Schmid . |
| 5,747,102 * | 5/1998 | Smith et al. ........................... 427/96 |
| 5,755,881 | 5/1998 | Fenoglio et al. . |

FOREIGN PATENT DOCUMENTS 07008879 1/1995 (JP) .

* cited by examiner

Primary Examiner—Laura Edwards
(74) Attorney, Agent, or Firm—Oblon, Spivak, McClelland, Maier & Neustadt, P.C.

(57) ABSTRACT

An apparatus for forming a film of a process liquid, comprising a mounting table for supporting the substrate to be processed substantially horizontally, a process liquid supply device for supplying a process liquid for processing the substrate, a linear nozzle having a header space which has a length substantially corresponding to a diameter of the substrate and a liquid discharge portion, the header space mutually communicating with the liquid discharge portion, a liquid inlet port which communicates with the process liquid supply device and whose opening is formed above the header space, a moving device for relatively moving the linear nozzle and the mounting table while the liquid discharge portion faces the substrate on the mounting table, and a control device for controlling a viscosity of the photoresist solution within the header space or controlling a temperature of the developing liquid in the header space.

42 Claims, 16 Drawing Sheets

PROCESS LIQUID FILM FORMING APPARATUS

CROSS-REFERENCE TO RELATED APPLICATIONS

This is a Continuation-in-Part application of U.S. patent application Ser. No. 08/979,781, filed Nov. 26, 1997, U.S. Pat. No. 5,976,256 the entire contents of which are incorporated herein by reference.

BACKGROUND OF THE INVENTION

The present invention relates to a apparatus for forming film of a photoresist liquid or a developing liquid on a substrate such as an LCD substrate and a semiconductor wafer.

In liquid crystal display (LCD) manufacturing processes, a photolithography technique is employed. In the photolithographic technique, a resist is first coated on a glass substrate and a predetermined pattern is then formed on the coated resist by exposing the resist to light followed by developing it. In this manner, a resist film having the predetermined pattern is formed on the surface of the glass substrate. If the resist pattern is further subjected to a film formation process and an etching process, a circuit formed of a semiconductor layer, an insulating layer and an electrode layer can be formed on the substrate in a predetermined pattern.

For example, U.S. patent application Ser. No. 08/914,819 (filed on Aug. 20, 1997) discloses a resist coating apparatus for an LCD substrate having a slit nozzle. The conventional apparatus, as shown in FIG. 1, has a nozzle 1 having a linear slit-form discharge port 2. A passage 1a communicates with a resist solution supply source (not shown) and a liquid storage portion 1c of the nozzle 1 through an entrance 1b. The liquid storage portion 1c communicates with a slit-form discharge port 2. While a resist solution 3 is being discharged from the slit nozzle 1 in the form of a band, the nozzle 1 is moved along an LCD substrate from one side to the opposite side in a scanning manner, thereby coating the resist on the substrate.

In the nozzle 1 of the conventional apparatus, however, pressure P2 applied to the peripheral regions of the slit-form discharge port 2 tends to be higher than pressure p1 applied to the middle region thereof, with the result that the amount of the resist solution discharged from the peripheral regions is increased compared to that from the middle region. Consequently, the resist solution discharged from the peripheral regions becomes thicker than that from the middle region, as shown in FIG. 2. Furthermore, since the viscosity of the resist solution is influenced by the variance in discharge pressure of the resist solution, the resist solution discharged from both peripheral regions of the discharge port 2 becomes thick. Consequently, the resist film 4 formed an LCD substrate G is thick at the both lateral sides as shown in FIG. 3. As a whole, the resist film is formed with a non-uniform thickness, with the result that the product yield decreases.

In addition, when the film is formed by coating the resist solution discharged from the nozzle 1 on the LCD substrate, other factors such as ambient temperature and static electricity have effects on the resist film formation. Also for this reason, the resultant resist film becomes non-uniform.

Recently, a demand has arisen for a surface processing technique capable of forming a micro pattern on a wafer in the order of a sub micron. When the micro pattern formed on the wafer is developed, it is necessary to properly control temperature of a developing liquid which is sensitive for a change in temperature. Then, in a conventionally used apparatus, the developing liquid is controlled at a proper temperature while it is stored in a header space.

To describe more specifically, a flow passage is formed in the header space, thermo-controlled water set at a predetermined temperature is allowed to flow. It follows that the developing liquid in the header space is properly thermo-controlled with heat imparted from the thermo-controlled water. Accordingly, the developing liquid controlled at an equal temperature is supplied uniformly to an entire wafer surface.

However, since the wafer to which the developing liquid is to be supplied is mounted on a spin chuck, the center portion of the wafer directly supported by the spin chuck is higher in in-plain temperature than a peripheral portion not supported directly by the spin chuck. Therefore, if the developing liquid of an equal temperature is supplied to the entire surface of the wafer, the center portion and the peripheral portion of the wafer may not be developed equally (uniformly).

BRIEF SUMMARY OF THE INVENTION

An object of the present invention is to provide a process liquid film forming apparatus capable of forming a film uniform in thickness by controlling an amount of a coating solution to be discharged to be supplied in the form of a uniform band.

An object of the present invention is to provide a process liquid film forming apparatus capable of coating a process liquid uniformly over an entire surface of a substrate.

According to the present invention, there is provided an apparatus for forming a film of a process liquid, comprising:
a mounting table for supporting the substrate to be processed substantially horizontally;
process liquid supply means for supplying a process liquid for processing the substrate;
a linear nozzle having a header space which has a length substantially corresponding to a diameter of the substrate, and a liquid discharge portion, the header space mutually communicating with the liquid discharge portion;
a liquid inlet port which communicates with the process liquid supply means and whose opening is formed above the header space;
moving means for relatively moving the linear nozzle and the mounting table while the liquid discharge portion faces the substrate on the mounting table; and
viscosity control means for controlling a viscosity of the process liquid in the vicinity of the liquid discharge portion.

According to the present invention, there is provided an apparatus for forming a film of a process liquid, comprising:
a mounting table for supporting a substrate to be processed substantially horizontally;
a linear nozzle having a header space which has a length substantially corresponding to a diameter of the substrate, and a liquid discharge portion, the header space mutually communicating with the liquid discharge portion;
process liquid supply means having a supply passage which communicates the header space of the linear nozzle and supplies a process liquid for processing the substrate to the header space;

a liquid inlet port which communicates with the process liquid supply means and whose opening is formed above the header space;

moving means for relatively moving the linear nozzle and the mounting table while the liquid discharge portion faces the substrate on the mounting table; and temperature control means for controlling a temperature of the process liquid passing through the supply passage.

According to the present invention, there is provided an apparatus for forming a film of a process liquid, comprising:

a mounting table for supporting the substrate to be processed substantially horizontally;

process liquid supply means for supplying a process liquid for processing the substrate;

a linear nozzle having a header space which has a length substantially corresponding to a diameter of the substrate, and a liquid discharge portion, the header space mutually communicating with the liquid discharge portion;

a liquid inlet port which communicates with the process liquid supply means and whose opening is formed above the header space;

moving means for relatively moving the linear nozzle and the mounting table while the liquid discharge portion faces the substrate on the mounting table; and temperature control means for controlling temperature of the process liquid in the vicinity of the liquid discharge portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinbelow, preferable embodiments of the present invention will be explained with reference to the accompanying drawings. We will explain the case in which the present invention is applied to an apparatus for coating resist on an LCD glass substrate.

Figure 4:
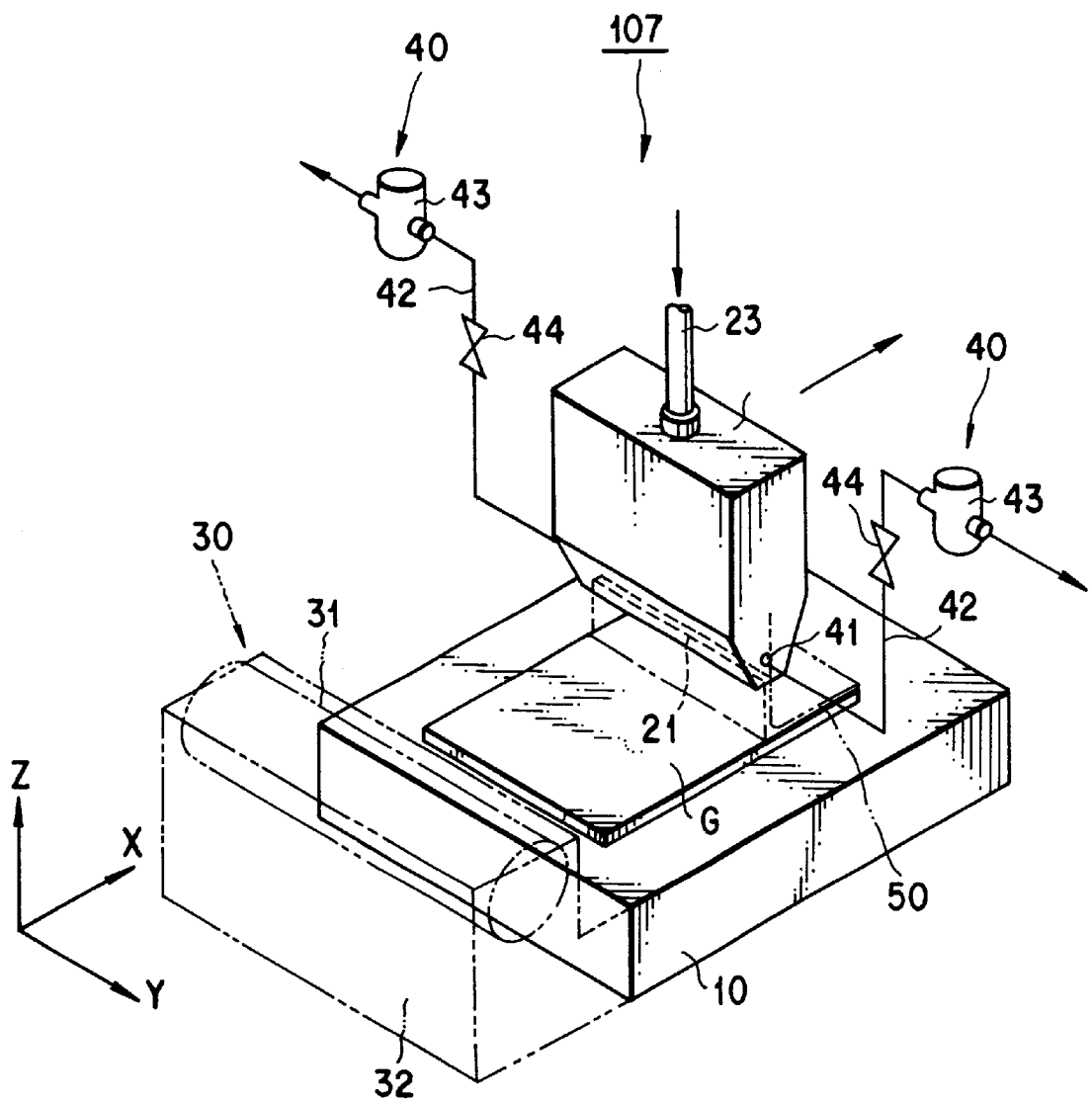
FIG. 4 is a schematic perspective view of a film-coating apparatus according to an embodiment of the present invention.
Figure 5:
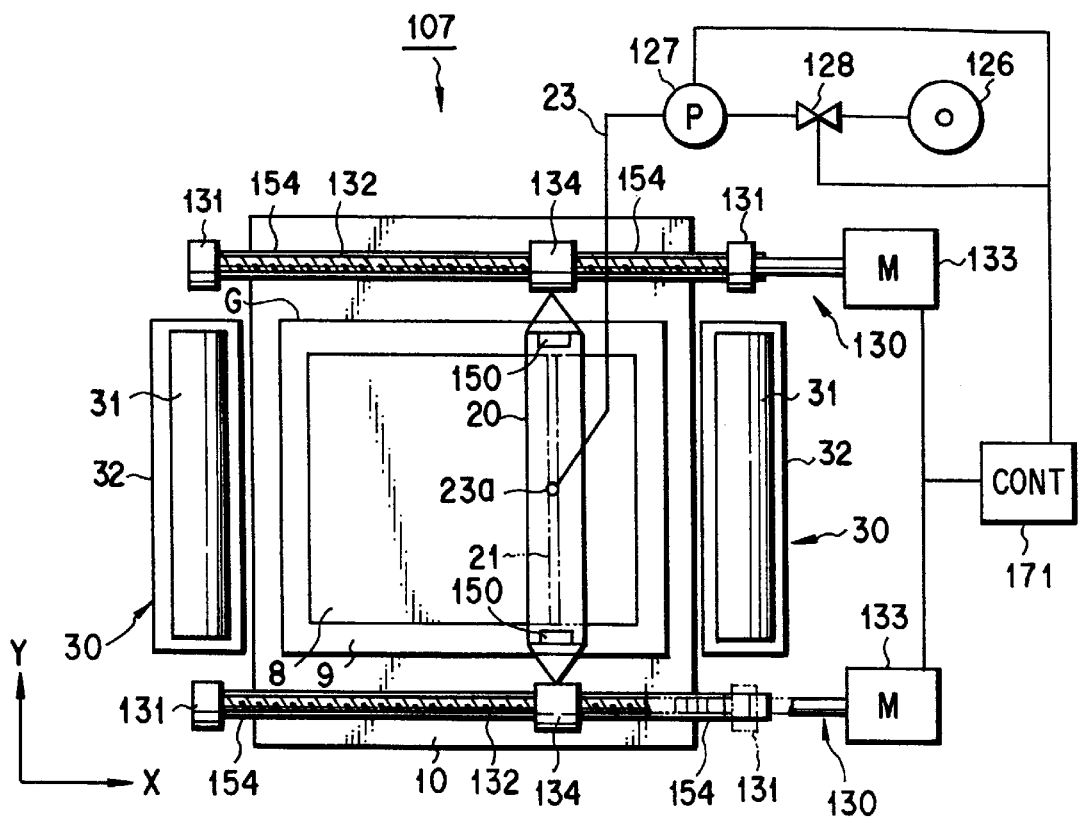
FIG. 5 is a plan view of a film coating apparatus according to an embodiment of the present invention, with a block diagram of peripheral devices.

As shown in FIGS. 4 and 5, a film-coating apparatus 107 comprises a mounting table 10, a slit nozzle 20, and two waiting sections 30. The mounting table 10 has a vacuum adsorption mechanism (not shown) for holding a glass substrate G (650 mm×550 mm) horizontally by adsorption force. The slit nozzle 20 has a slit-form liquid discharge port 21 extending in the Y-axis and is movably supported by a moving mechanism 130 in the X-axis direction. The length of the slit-form liquid discharge port 21 is slightly shorter than that of a short side of the substrate G. This is because the glass substrate G has a non resist-coating region 9 in the periphery of a resist coating region 8.

As shown in FIG. 5, the moving mechanism 130 comprises a pair of ball screws 132, a pair of motors 133, a pair of movable members 134, and a pair of linear guides 154. The pair of ball screws 132 and linear guides 154 extend in parallel to the X-axis. The substrate G is mounted on the mounting table 10 between the pair of linear guides 154. The pair of the ball screws 132 are supported by two bearings 131, respectively on the mounting table 10.

The pair of movable members 134 are provided respectively at both ends of the slit nozzle 20. Each of the movable members 134 comprises a ball nut and a nozzle waving mechanism 138 (described later). Each end of the slit nozzle 20 is connected to the ball screw 132 and the linear guide 154 via the movable member 134.

Furthermore, interval maintaining mechanisms 150 are respectively provided at both ends of the slit nozzle 20. The interval maintaining mechanism 150 serves for maintaining a constant interval between the discharge port 21 of the nozzle 20 and a coating surface 8 of the substrate G. As the interval maintaining mechanism 150, a roller moving on the peripheral non-coating region 9 of the substrate G is used in the U.S. patent application Ser. No. 08/914,819.

One end of each of ball screws is connected to a driving axis of a motor 133. The electric circuits of the motors 133 are separately connected to an outlet portion of a controller 171. The motors 133 are therefore controlled synchronously by the controller 171. In such a moving mechanism 130, when a screw 132 is rotated, the nozzle 20 moves in the X-axis while maintaining a constant distance from the coating surface 8 of the substrate G mounted on the mounting table 10.

Next, a supply route of the resist solution to the slit nozzle 20 will be explained.

As shown in FIG. 5, the resist solution supply route comprises a passage 23, a resist solution supply source 126, diaphragm pump 127, and a valve 128. The slit nozzle 20 has an inlet port 23a in the upper portion thereof. The entrance 23a is connected to the passage 23 of the resist solution supply route. The resist solution is introduced in the nozzle 20 through the entrance 23a. The passage 23 is connected to the resist solution supply source 126 through the diaphragm pump 127 and the valve 128. The passage 23 may be formed of a soft-resin tube or a stainless-steel flexible hose. The operation circuits of the diaphragm pump 127 and the valve 128 are connected to the outlet portion of the controller 171, thereby controlling an amount of the resist solution to be supplied to the nozzle 20.

Two waiting sections 30 face each other with the mounting table 10 interposed therebetween. The waiting sections 30 are provided close on the sides of the mounting table 10 in parallel to the Y-axis, respectively. A prime roller 31 is provided in the waiting section in order to prevent dehydration of the liquid discharge port 21 at the waiting section (not in operation).

Figure 6:
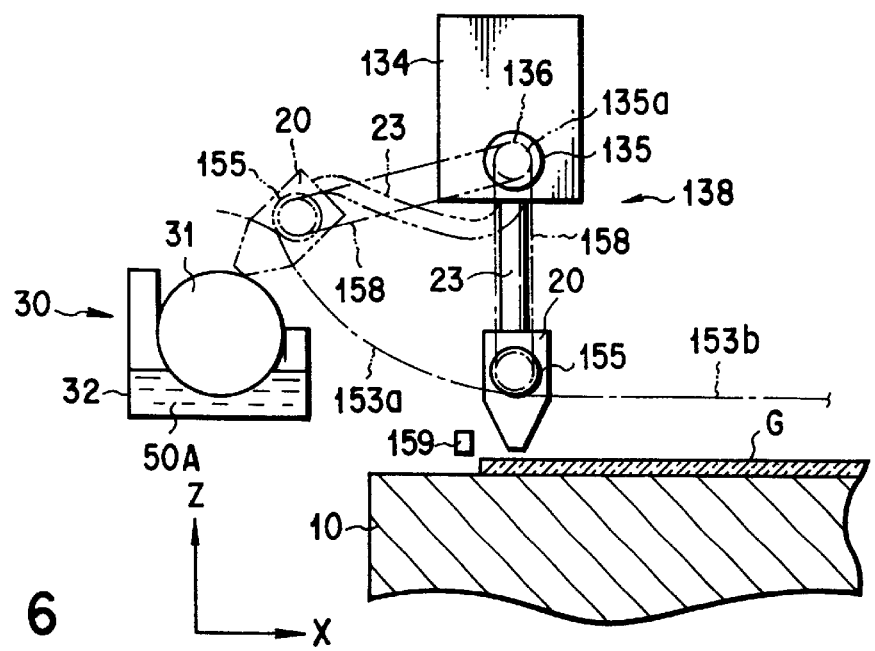
FIG. 6 is a schematic view of a slit nozzle for explaining the initiation of its operation.

As shown in FIG. 6, the prime roller 31 is housed horizontally within a container 32 at the waiting section 30. The lower half portion of the prime roller 31 is dipped in a solvent (thinner) 50A in the container 32. The prime roller 31 is rotatably supported by a rotating mechanism (not shown). When the nozzle 20 stays at the waiting section, the liquid discharge port 21 is in contact with the peripheral surface of the prime roller 31. When the prime roller 31 is rotated, thinner 50A is attached on the peripheral surface of the prime roller 31 and transferred to the liquid discharge port 21 of the nozzle. In this manner, the dehydration of the liquid discharge port 21 is successfully prevented, and thereby a change in concentration of the resist solution present in the liquid discharge port 21 can be suppressed.

The nozzle waving mechanism 138 is provided between the slit nozzle 20 and the movable member 134. The nozzle waving mechanism 138 is a belt-driving mechanism comprising a motor 135, a driving pulley 136, a follower pulley 155, and a belt 158. The motor 135 is provided on a lateral side of the movable member 134 in such a manner that its driving axis 135a is positioned horizontally. A driving pulley 136 is engaged with the driving axis 135a. The follower pulley 155 is provided on a lateral side of the nozzle 20. The belt 158 is stretched from the follower pulley 155 to the driving pulley 136. The outer wheel of the follower pulley 155 is provided freely rotatable. When the outer wheel is in contact with guide rails (153a, 153b) and moves them, the nozzle 20 is guided. The guide rail is formed of a curve portion 153a and a straight portion 153b.

The sensor 159 is provided in the proximity of the coating initiating site. The sensor 159 is responsible for detecting the nozzle 20 present on the coating initiation site. When a nozzle detection signal is input in the controller 171 from the sensor 159, the controller 171 directs the motor 135 of the nozzle waving mechanism 138 to stop its movement and to initiate driving of the X-axis moving mechanism 130.

Now, the slit nozzle 20 will be explained in detail.

Figure 7:
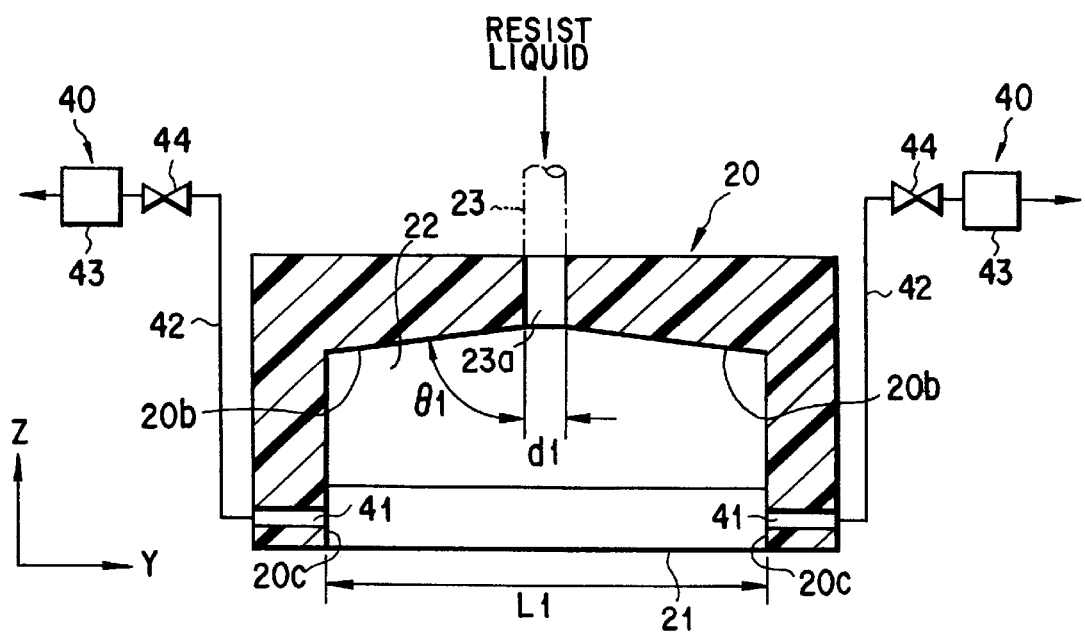
FIG. 7 is a cross sectional view of a film-coating apparatus according to first embodiment of the present invention, with a block diagram of peripheral devices.

As shown in FIG. 7, the slit nozzle 20 comprises a liquid storage portion (header portion) 22 and a liquid discharge port 21. The liquid storage portion 22 is defined by a downwardly/outwardly inclined inner wall 20b, a first vertical inner wall 20c, a second vertical inner wall 20d, a downwardly/inwardly inclined inner wall 20e, and a third vertical inner wall 20f of the nozzle. A short side face of the liquid storage portion 22 is defined by the downwardly/outwardly inclined inner wall 20b and the first vertical inner wall 20c. A longer side face of the liquid storage portion 22 is defined by the second vertical inner wall 20d, the downwardly/inwardly inclined inner wall 20e, and the third vertical inner wall 20f. Note that the first vertical inner wall 20c and the liquid discharge port 21 are contiguously formed. An opening of the communication passage 41 of the film thickness control means 40 is formed in the first vertical inner wall 20c.

At the upper middle position of the liquid storage portion 22, the inlet port 23a is formed. The resist solution supply passage 23 is connected to the liquid storage portion 22 at the inlet port 23a. The liquid discharge port 21 is provided contiguously to the liquid storage portion 22. Note that only one inlet port 23a is connected to the liquid storage portion 22 in the figure, however, a plurality of inlet ports 23a may be connected to the liquid storage portion 22. The nozzle 20 is formed of an ethylene fluoride based resin such as PTFE. Since an air conditioning apparatus (not shown) is provided in the resist solution supply route, the temperature of the resist solution 50 is controlled to fall within an optimum range.

The diameter of the liquid storage portion 22 is gradually widened downwardly since the inner wall 22b becomes widened downwardly and outwardly until it reaches the same size as the Y-axis size L1 of the liquid discharge port 21, at the liquid storage portion 22 sandwiched by the first vertical inner walls 20c.

Figure 13:
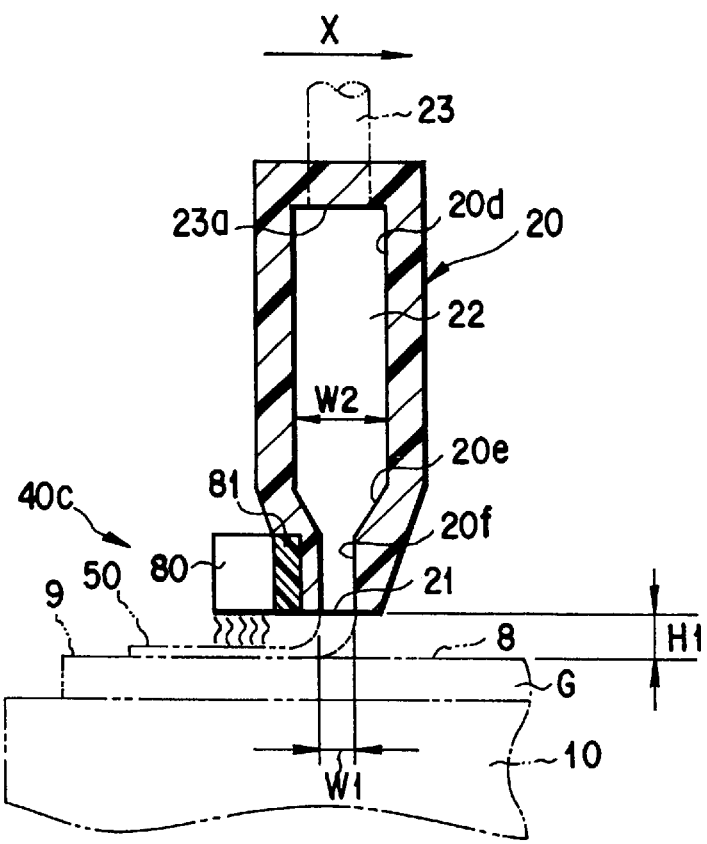
FIG. 13 is a schematic sectional view of the apparatus of fourth embodiment taken in the line XIII—XIII of FIG. 12.

As shown in FIG. 13, the size W2 in the X-axis direction of the liquid storage portion 22 is larger than the size W1 in the X-axis direction of the liquid discharge port 21. The size W2 in the X-axis direction is constant in the liquid storage portion sandwiched by the second vertical inner walls 20d (positioned upward). However, the size W2 of the liquid storage portion 22 is gradually reduced, since the inner wall 20e becomes narrower downwardly/inwardly, until it reaches the same size as the X-axis size W1 of the liquid discharge port 21 at the liquid storage portion 22 sandwiched by the third vertical walls 20f (positioned downward).

To form a coating resist with a uniform film thickness, it is desirable that a clearance H1 between the liquid discharge port 21 and the substrate G be as small as possible. It is preferable that the clearance H1 fall within the range of 100 to 200 μm. When the resist is coated over a substrate G of 550 mm×650 mm, the sizes of L1, W1, and W2 of the nozzle 20 are desirably 540 mm, 0.10 to 0.15 mm, and 20 mm, respectively.

The diameter $d_1$ of the liquid inlet port 23a is 15±1 mm. The downwardly/outwardly inclined inner wall 20b forms an angle of $\theta_1$ (85°±2°) with the Z-axis.

It should be noted that the scanning speed of the nozzle 20 is 20 mm/second when the viscosity of the resist solution is 15 cp (centipoise) and 35 mm/second when the viscosity of the resist solution is 10 cp (centipoise).

Now, the film-thickness control means will be described. As shown in FIG. 7, the film thickness control means 40 of a first embodiment comprises a plurality of communication paths 41, suction pipes 42, diaphragm pumps 43 and valves 44. Each of the communication paths 41 passes through the lower side wall portion of the nozzle in the vicinity of the end portion of the nozzle slit in the longitudinal direction. One end opening of the communication path 41 is provided at the liquid discharge port 20c and the other end is connected to the diaphragm pump 43 on the sucking side by way of the suction pipe 42. Note that the valve 44 is interposed between the communication path 41 and the diaphragm pump 43. Both operations of the diaphragm pump 43 and the valve 44 are controlled by the controller 171.

The operation of the aforementioned film-thickness control means will be explained below.

Figure 8:
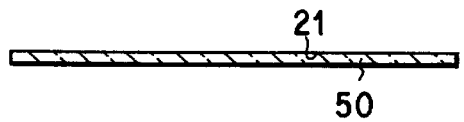
FIG. 8 is a schematic transverse sectional view of a coating film formed by supplying the coating solution from a slit nozzle of the present invention.

When the nozzle 20 is positioned at the waiting section 30, the liquid discharge port 21 of the nozzle 20 is brought in contact with the prime roller 31 to prevent dehydration, while the substrate G is mounted on the mounting table 10 by transfer means (not shown) and held by an adsorption force. Subsequently, the resist solution 50 is supplied from the resist solution supply source 126 to the nozzle 20. At this time, pressure P2 of the resist solution 50 discharged from the peripheral region of the liquid discharge port 21 is reduced by the film-thickness control means 40 to the same value as the pressure P1 of the resist solution 50 discharged from the middle region of the liquid discharge port 21. As a result, the resist solution 50 can be supplied onto the substrate G from the liquid discharge port 21 in the form of a band having a uniform thickness, as shown in FIG. 8. Thereafter, if the nozzle 20 is moved in the X-axis direction, the resist solution is successfully coated on the coating region 8 of the substrate G.

After the resist film is formed on the coating region 8 of the substrate G in this manner, the resist solution supply is terminated and the nozzle 20 is moved back to the waiting section 30. The liquid discharge port 21 is brought in contact with the prime roller 31 and retained in this state until next use. On the other hand, the resist-coated substrate G is unloaded from the mounting table 10 by transfer means (not shown) and transferred to a next process device.

Figure 1:
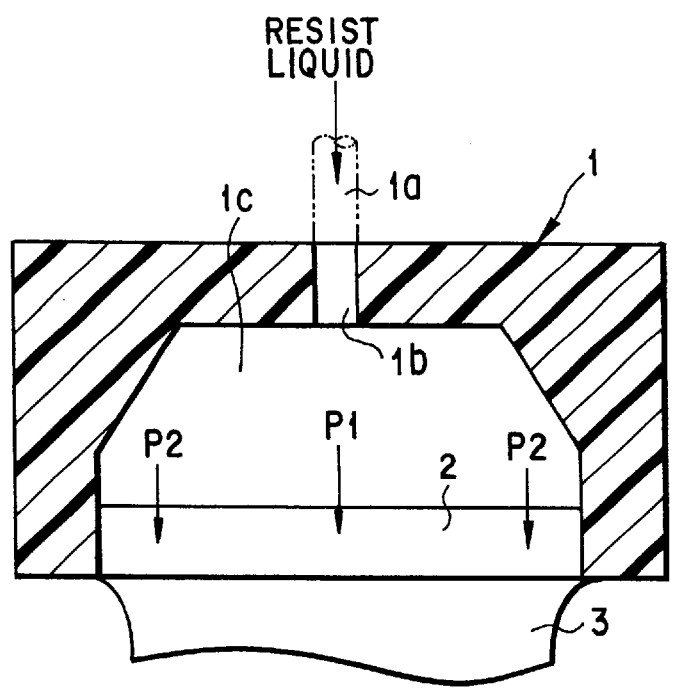
FIG. 1 is a schematic sectional view of a slit nozzle of a conventional apparatus.
Figure 2:
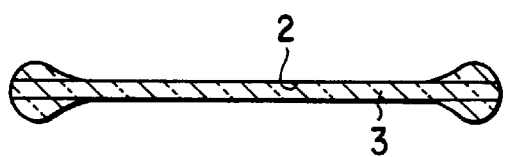
FIG. 2 is a schematic transverse sectional view of a coating film formed by supplying a coating solution from the slit nozzle of a conventional apparatus.
Figure 3:
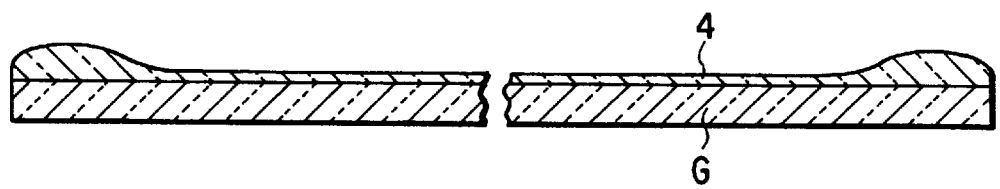
FIG. 3 is a magnified sectional view of a coating film formed by a conventional apparatus.
Figure 9:
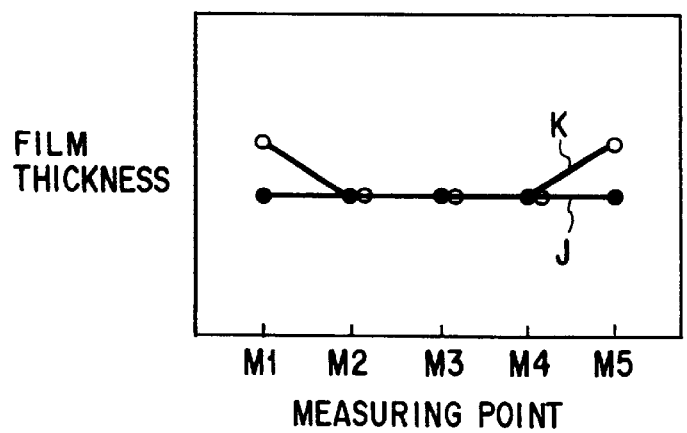
FIG. 9 is a profile showing the difference in thickness of the resist film formed on an LCD glass substrate depending upon positions thereof.

FIG. 9 shows differences in thickness of the resist film formed on the substrate G by plotting measuring point of the resist film on the abscissa and film thickness on the ordinate. To describe more specifically, the resist-film thickness was measured by Ellipso meter with respect to five points (M1 to M5) on the substrate G in the Y axis. In this figure, characteristic line J connecting solid-circles represents the differences in the film thickness formed by the apparatus of the present invention shown in FIG. 7. Characteristic line K connecting open-circles indicates the differences of the resist film coated by the conventional apparatus shown in FIG. 1. As is apparent from the figure, the resist film coated by the conventional apparatus is thicker in the peripheral measuring points (M1, M5) than the middle measuring points (M2 to M4), whereas no significant difference was observed between the peripheral measuring points (M1, M5) and the middle measuring points (M2 to M4) in the resist film of the present invention. It was thus clearly confirmed that the coating resist is formed in a uniform thickness over the entire surface of the substrate G when the apparatus of the present invention shown in FIG. 7 is used.

Figure 10:
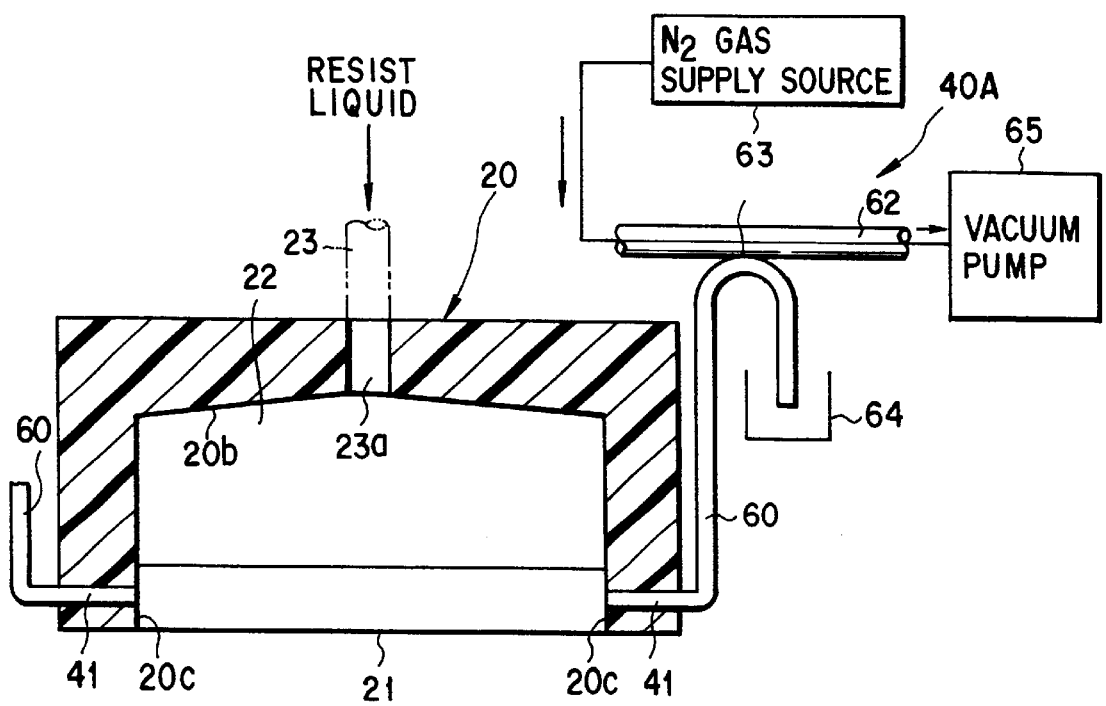
FIG. 10 is a cross-sectional view of a film-coating apparatus according to second embodiment of the present invention, with a block diagram of peripheral devices.

Next, we will explain the film thickness control means 40A of second embodiment with reference to FIG. 10. Note that explanation for the portions of second embodiment common to the first embodiment will be omitted.

The film thickness control means 40A of second embodiment has an ejector mechanism comprising a plurality of communicating paths 41, suction pipes 60, pressurized gas transmitting tubes 62, $N_2$ gas supply sources 63, drain tanks 64, and vacuum pumps 65. The suction pipe 60 has a reverse U shape. One end of the suction pipe 60 is connected to a communication path 41 and the other end (open end) is inserted into the drain tank 64. The uppermost portion (opening) 61 is connected to the pressurized gas transmitting tube 62. One end of the pressurized gas transmitting tube 62 is connected to the $N_2$ gas supply source 63. The other end is connected to a suction port of the vacuum pump 65.

When the $N_2$ gas is allowed to pass through the pressurized gas transmitting tube 62 and the tube 62 is then evacuated by the vacuum pump 65, the pressure of the suction pipe 60 is reduced through the opening 61. As a result, the resist solution is sectioned into the suction pipe 60 from both ends (in the longitudinal direction) of the liquid discharge port 21. The resist solution thus sectioned is collected in the drain tank 64. Since the resist solution present in the vicinity of the nozzle inner wall 20c of the liquid discharge port 21 is sectioned to remove, it is possible to reduce the discharge pressure of the resist solution form this region. As a result, the discharge pressure P2 of the resist solution discharged from the peripheral portion can be controlled to be equal to pressure 1 of that from the center portion. Therefore, the resist solution 50 can be supplied from the liquid discharge port 21 onto the substrate G in the form of a band having a uniform thickness, as shown in FIG. 8.

Figure 11:
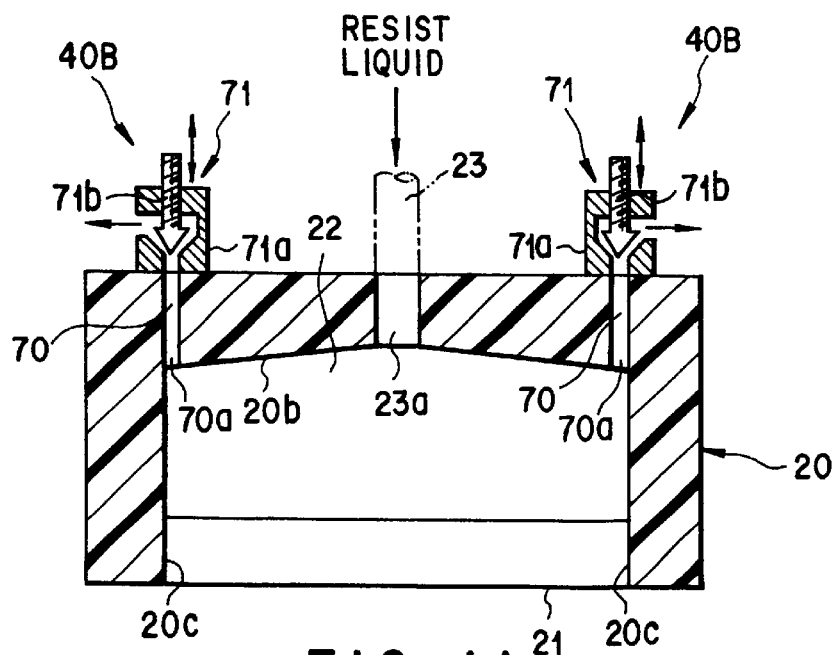
FIG. 11 is a cross-sectional view of a film-coating apparatus according to third embodiment of the present invention.

Next, we will explain the film-thickness control means 40B of third embodiment with reference to the FIG. 11. Note that explanation for the portions of third embodiment common to the first embodiment will be omitted.

The film thickness control means 40B of third embodiment comprises an air ventilation path 70 and an opening control valve mechanism 71. The lower end of the air ventilation path 70 is connected to a storage portion 22 at an intersection between the downwardly/outwardly inclined inner wall 20b and the side inner wall 20c. The air ventilation path 70 and the side inner wall 20c are arranged in line along the Z-axis.

The opening control valve mechanism 71 has a main body 71a and a valve 71b. An entrance of the main body 71a is connected with the upper end of the air ventilation path 70. The outlet port of the main body 71a is communicated with the outer atmosphere. The valve 71b, is a liftable screw mechanism engaged with the main body 71a. The main body 71a is opened/shut by the valve 71b.

Since the discharge pressure P2 of the resist solution supplied from the both peripheral portions can be reduced by the film thickness control means 40B, discharge pressure P2 can be controlled to be equal to pressure P1 of the resist solution discharged from the center portion.

Now, the film thickness control means 40C of fourth embodiment will be explained with reference to FIGS. 12 and 13. Explanation for portions of fourth embodiment common to the first embodiment will be omitted.

The film thickness control means 40C of fourth embodiment comprises two heaters 80. Each heater 80 is provided on a side of the liquid discharge port 21 of the nozzle 20 via an insulation spacer 81. Note that the heater 80 may not always employ the insulation spacer 81 when it is provided on the nozzle 20. The heater 80 may be positioned at a small distance from the nozzle 20.

Figure 12:
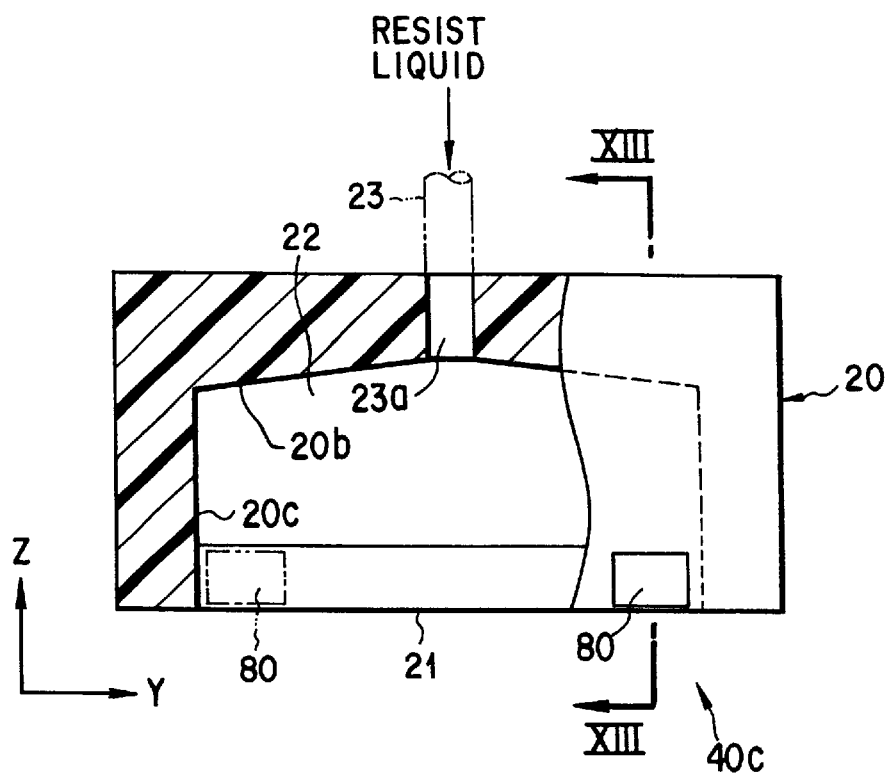
FIG. 12 is a cross-sectional view of a film-coating apparatus according to fourth embodiment of the present invention.

More specifically, the heater 80 is provided in the peripheral portion of the liquid discharge port 21 along the Y-axis, as shown in FIG. 12, and on the side of the nozzle 20 opposite to its moving direction (the X-axis), as shown in FIG. 13. A power source circuit of the heater 80 is connected to the outlet portion of the controller 171. The insulation spacer 81 is made of a resin having a small thermal conductivity or a plastic. The reason why the heater 80 is provided on the nozzle 20 via the spacer 81 is that if heat is directly transmitted from the heater 80 to the nozzle, viscosity of the resist solution 50 present at the liquid discharge port 21 is changed due to local temperature increase. By virtue of this arrangement of the heater, it is possible to minimize thermal influence upon the resist solution 50 present at the liquid discharge port 21. On the other hand, the resist solution 50 is heated immediately upon supply onto the substrate G. As a result, the resist film can be formed on the substrate G in a uniform thickness. To describe more precisely, the resist solution 50 discharged from the both ends (in the longitudinal direction) of the liquid discharge port 21 can be reduced in flow rate (to increase flow resistance) since the viscosity is increased by the heater. Therefore, the flow rate (flow resistance) of the resist solution 50 discharged from the peripheral portion can be controlled to be equal to the flow rate of that from the center portion of the liquid discharge port 21.

In fourth embodiment, the viscosity of the resist solution 50 is controlled in consideration of the facts that the viscosity of the resist solution 50 varies depending upon the pressure between the end portions (in the longitudinal direction) and the center portion of the liquid discharge port 21 and depending upon the influence of ambient temperature and static electricity immediately upon the supply on the substrate G. In this manner, the film thickness of the coating resist can be controlled uniform. Since a solvent (thinner) 50A contained in the resist solution 50 supplied on the substrate G can be volatilized by the heater 80, the dehydration of the resist solution 50 can be accelerated, reducing the resist film formation time. Consequently, the throughput is further improved.

In the aforementioned embodiments, the nozzle 20 is moved. However, the mounting table 10 may be moved relative to a fixed nozzle. Alternatively, both nozzle 20 and mounting table 10 may be moved.

In the aforementioned embodiments, the mounting table 10 has a vacuum suction mechanism for holding the substrate. However, as the substrate holding means, a plurality of rollers arranged in line may be used.

The film coating apparatus constructed as described above may be used alone as a resist film coating apparatus for an LCD substrate or used by being installed in a resist coating/developing process system. Hereinbelow, we will explain the resist coating/developing process system with the aforementioned film coating apparatus installed therein.

Figure 14:
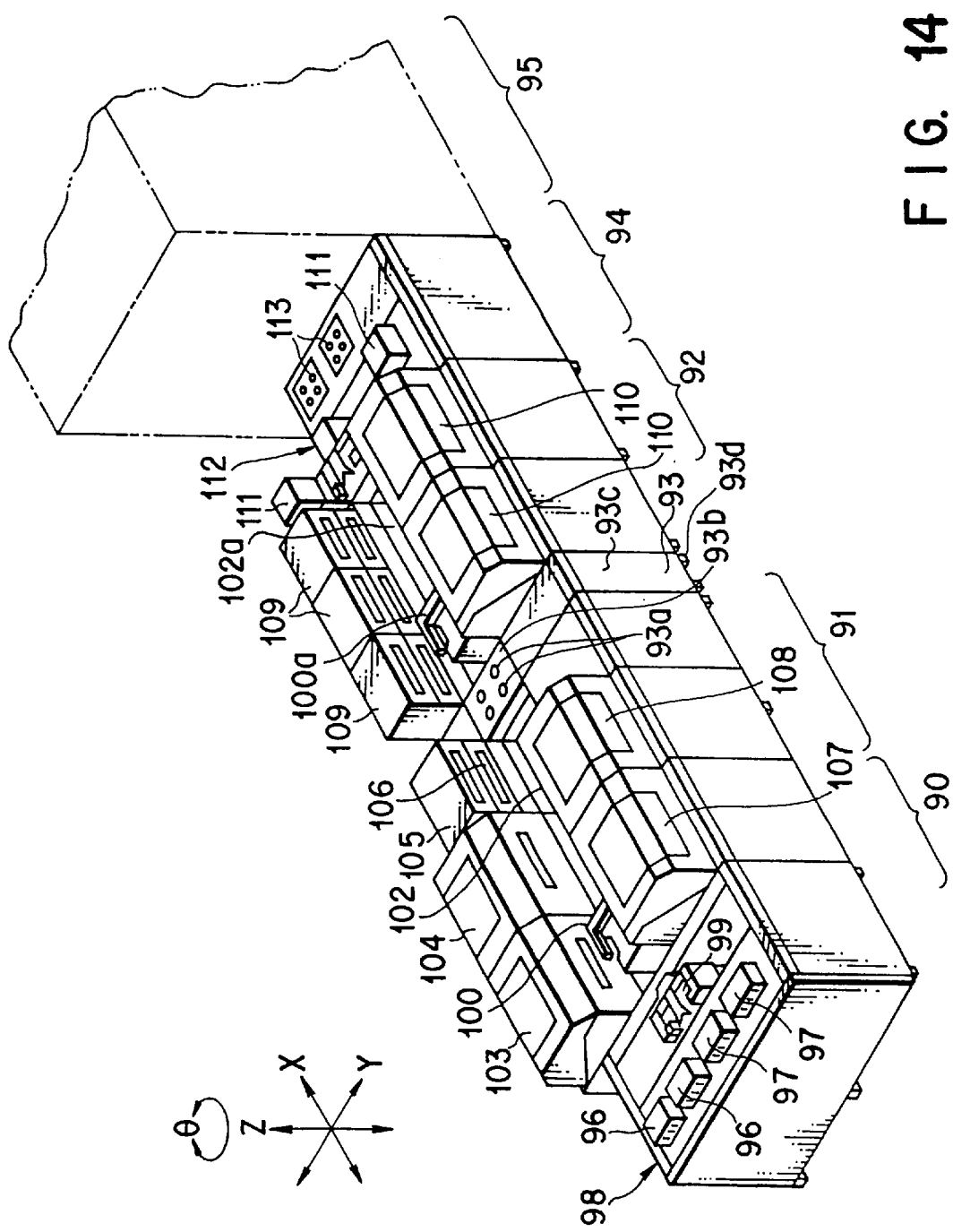
FIG. 14 is a schematic perspective view of a coating/developing process system having a film-coating apparatus.

As shown in FIG. 14, the resist coating/developing process system comprises a loader portion 90, two sub-arm mechanisms 99, 112, two main arm mechanisms 100, 100a, a first process section 91, a second process section 92, and an intermediate relay section 93. Note that a light-exposure device 95 for irradiating the coating resist, may be connected to the second process section 92 via the transfer portion 94.

Now, we will explain the case where an LCD substrate G is processed by using the resist coating/developing process system. The LCD substrate G is taken out form the cassette 96 by the sub-arm mechanism 99, transferred to the main arm mechanism 100 and loaded in the first process section 91. The substrate G is scrub-washed in the brush washing device 103 and washed with high-pressure jet water in a jet water washing device 14. The substrate G is further subjected to an adhesion process performed in an adhesion process device 105. After the substrate G is cooled in the cool process device 106, the resist coating is carried out in the film coating device 107. Subsequently, unnecessary resist film is removed from the peripheral portion of the substrate G in the coating-film removing device 108. The substrate G is then baked with heat in the heat process device 109, transferred by the main arm 100a to the transfer mounting table 113, and then transferred by the second sub-arm mechanism 112 from the transfer table 113 to the light-exposure device 95. After the light-exposure process is completed in the light-exposure device 95, the substrate G is developed in the development device 110 and rinsed with pure water. In this manner, the developing process is completed.

The LCD substrates G to which a series of process treatments have been applied, are stored in a cassette 97 at the loader portion 90. The cassette 97 storing the substrates G is unloaded out of the system.

In the aforementioned embodiments, the film-coating apparatus according to the present invention is applied to the resist coating apparatus for an LCD substrate. The apparatus of the present invention may be applied to a film-coating apparatus for a semiconductor wafer and CD other than the LCD substrate or applied to an apparatus for coating a green film on an electric board. In the apparatus of the present invention, a polyimide based coating solution (PIQ) and a coating solution containing a glass ingredient (SOG) may be used other than the resist.

The present invention makes it possible to reduce the pressure of the coating solution discharged from the both peripheral region of the slit-form discharge port to the equal pressure as that of the coating solution discharged from the other portion of the discharge port. Therefore, the discharge pressure of the coating solution can be rendered uniform over the port, thereby supplying the coating solution in the form of a uniform band. Consequently, the resultant coating film is formed in a uniform thickness over the substrate surface and the product yield can be improved.

Furthermore, the present invention makes it possible to increase the viscosity of the coating solution discharged from both sides of the slit-form discharge port in the longitudinal direction, thereby reducing the flow rate thereof. Therefore, the flow rate of the coating solution discharged from both peripheral regions of the discharge port can be made equal to that from the middle region of the discharge port. As a result, the coating solution is discharged at a uniform flow rate in the form of a band to form a coating film over the entire substrate in a uniform thickness. The yield can be thus improved. In addition, the coating solution can be accelerated to dry by volatilizing a solvent contained in the coating solution by dehydration means. Hence, the coating film formation time can be shortened and the improvement of the throughput can be attained.

Figure 15:
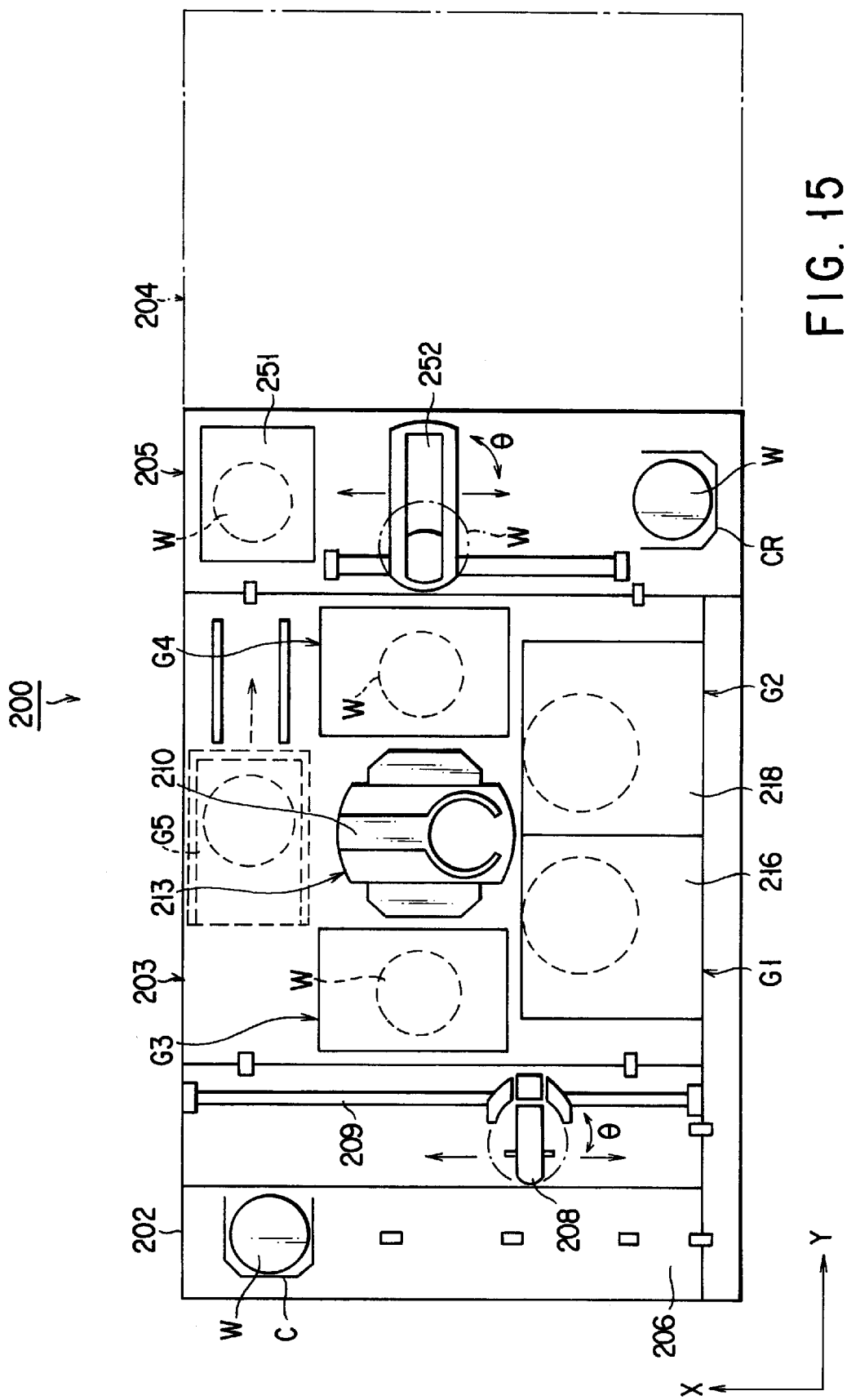
FIG. 15 is a plan view showing a schematic structure of coating and developing system.

As shown in FIG. 15, a coating/developing system 200 has a cassette section 202, a process section 203, and an interface section 205. This process system 200 is connected to a light exposure unit 204 via the interface section.

The cassette section 202 has a cassette mounting table 206 and a first sub-transfer arm mechanism 208. The cassette mounting table 206 extends in an X-axis direction. Four cassettes C are mounted on the cassette mounting table 206. A transfer passage 209 is formed along the cassette mounting table 206. The first sub-transfer arm mechanism 208 has an arm holder for holding a wafer W, an arm holder forward and backward driving mechanism (not shown), an X-axis driving mechanism (not shown), a Z-axis driving mechanism (not shown), and a θ rotation driving mechanism (not shown). The first sub-transfer arm mechanism 208 is moved by the X-axis driving mechanism (not shown) along the transfer passage 209. The arm holder is moved back and forth by the arm holder forward and backward driving mechanism, moved up and down by the Z-axis driving mechanism, and rotated about the Z-axis by the θ rotation driving mechanism.

The process section 203 has four process unit groups G1, G2, G3, G4 and a main transfer arm mechanism 210. The main transfer arm mechanism 210 is arranged near a center portion of the process section 203 and four process unit groups G1, G2, G3, G4 are arranged around the mechanism 210. The main transfer arm mechanism 210 has three arm holders 210, 211, 212, an arm holder forward and backward driving mechanism (not shown), a Z-axis driving mechanism (not shown) and a θ rotation driving mechanism. The arm holders 210, 211, 212 are moved back and forth by the arm holder forward and backward driving mechanism, moved up and down by the Z-axis driving mechanism, and rotated around the Z-axis by the θ rotation driving mechanism.

First and second process unit groups G1, G2 are arranged at a front side of the process system 200. The third process unit group G3 is arranged next to the cassette unit 202. A fourth process unit group G4 is arranged next to the interface section 205. If necessary, the fifth process unit group G5 may be additionally arranged at the rear side.

Figure 16:
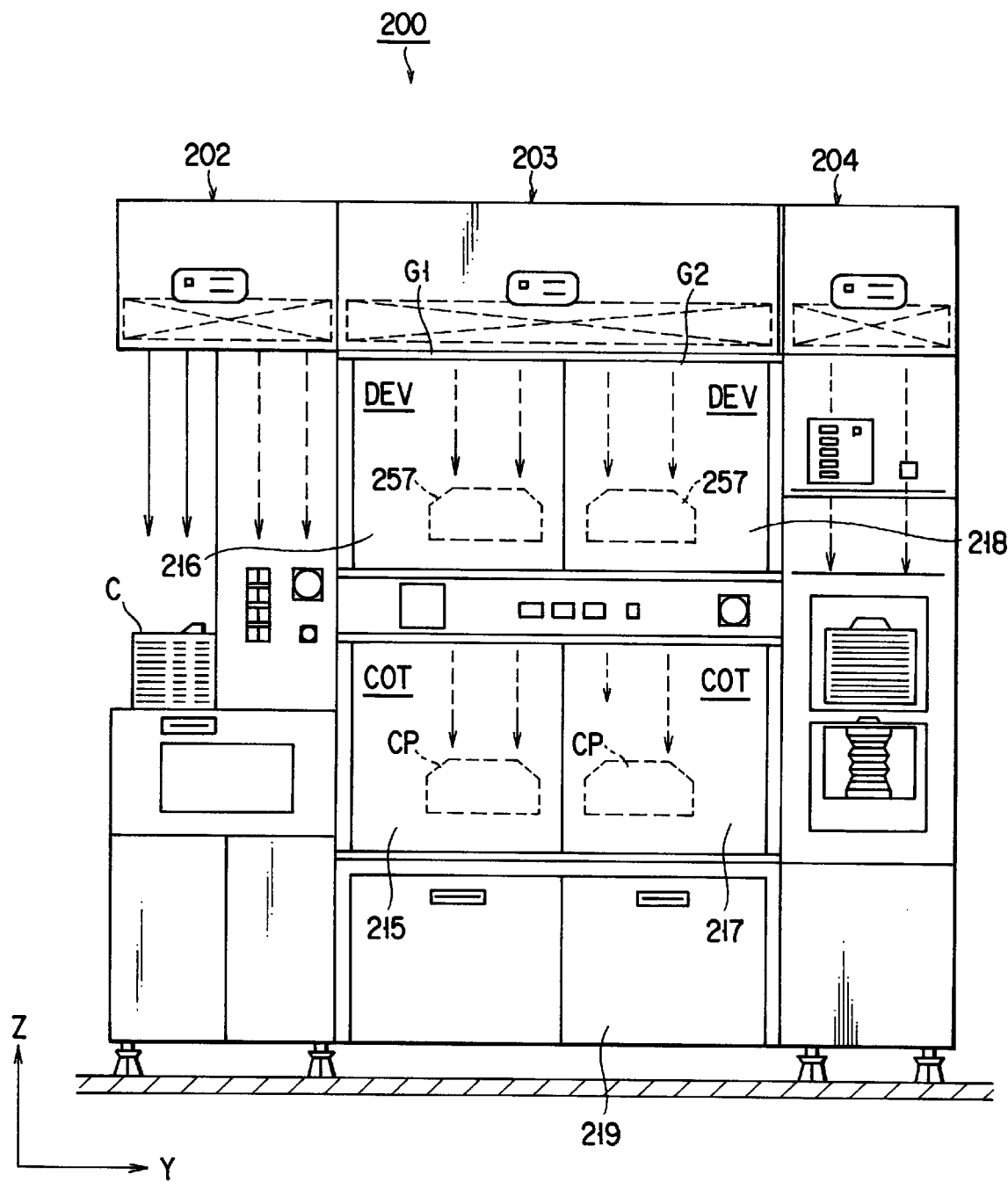
FIG. 16 is a front view showing a schematic structure coating and developing system.
Figure 26:
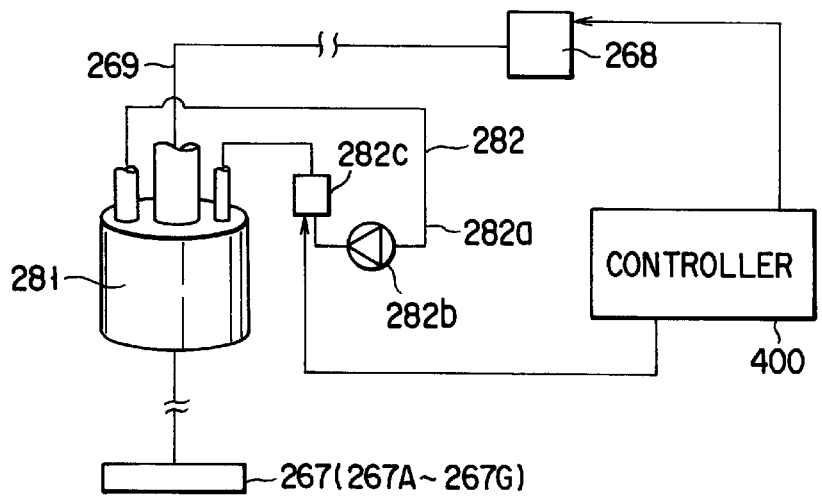
FIG. 26 is a cross sectional view of a process liquid film formation apparatus according to another embodiment of the present invention, with a block diagram of peripheral units.

As shown in FIG. 16, the first process unit group G1 has a resist coating unit 215 and a development unit 216. In the same manner, the second process unit group G2 has a resist coating unit 217 and a development unit 218. The resist coating units 215, 217 are positioned at a place lower than the development units 216, 218. Furthermore, a storage box 219 capable of storing a developing liquid tank 281 shown in FIG. 26 is provided below each of the resist coating units 215, 217.

The third process unit group G3 has a cooling unit 230, an adhesion unit 231, an alignment unit 232, an extension unit 233, and prebaking units 234, 235 and post-baking units 236, 237. There units 230–237 are stacked in a vertically-set multi stages.

The fourth process unit group G4 has a cooling unit 240, an extension cooling unit 241, an extension unit 242, a cooling unit 243, post-exposure baking units 244, 245, and post-baking units 246, 247. These units 240–247 are stacked in vertically-set multiple stages.

The interface section 205 has a peripheral light exposure unit 251 and a second sub-transfer arm mechanism 252. The second sub-transfer arm mechanism 252 is constructed in substantially the same manner as in the first sub-transfer arm mechanism 208.

Now, referring to FIGS. 17 and 18, the development unit 216 will be explained. Note that the second development unit 218 is constructed in substantially the same manner as in the first development unit 216.

A loading/unloading port (not shown) is formed in the front of the development unit 216. The loading/unloading port is opened and closed by a shutter (not shown). When the shutter is opened, the wafer W is loaded/unloaded into/from the development unit 216 through a loading/unloading port by the main transport arm mechanism 213.

A spin chuck 255 is arranged in the center of the development unit 216. The spin chuck 255 is connected to an axis 256a of a driving mechanism 256 at the lower portion thereof. The driving mechanism 256 houses a motor for rotation-driving the axis 256a and a cylinder for moving the axis 256a up and down.

A cup 257 is arranged so as to surround the spin chuck 255. The bottom of the cup 257 is inclined. At the most lowest portion of the bottom 258, a drainage pipe 259 is formed. The drainage pipe 259 communicates with a drain unit (not shown). The waste solution generated in the cup 257 is discharged into the drain unit by way of the drainage pipe.

On the other hand, an exhaust pipe 260 is formed on the uppermost portion of the cup bottom 258. The exhaust pipe 260 communicates with a suction exhaust unit (not shown) and a drain unit, independently. The mist generated in the cup 257 is discharged into the drain unit by way of the exhaust pipe 260.

Figure 18:
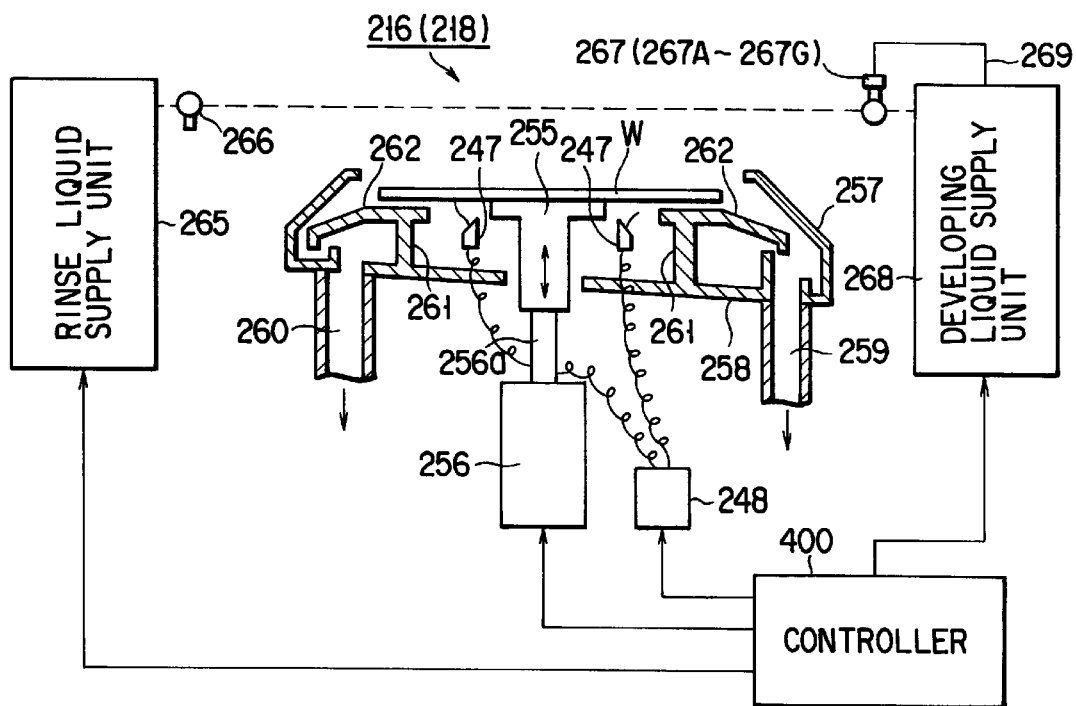
FIG. 18 is a cross-sectional view of the development unit, with a block diagram of peripheral units.

As shown in FIG. 18, a ring-form wall 261 is set upright on the bottom 258. To the upper end of the ring-form wall 261, a rectification plate 262 is attached. The rectification plate 262 is provided in the proximity to a rear surface of the wafer W which is held by the spin chuck 255 at a narrow interval between the rectification plate 262 and the wafer W. The peripheral portion of the rectification plate 262 is inclined downwardly outward.

A plurality of rear-surface washing nozzles 247 are arranged within the ring-form wall 261. The rear surface washing nozzles 247 communicates with a built-in tank (not shown) in the washing solution supply unit 248. Pure water serving as a washing solution is stored in the built-in tank.

Figure 17:
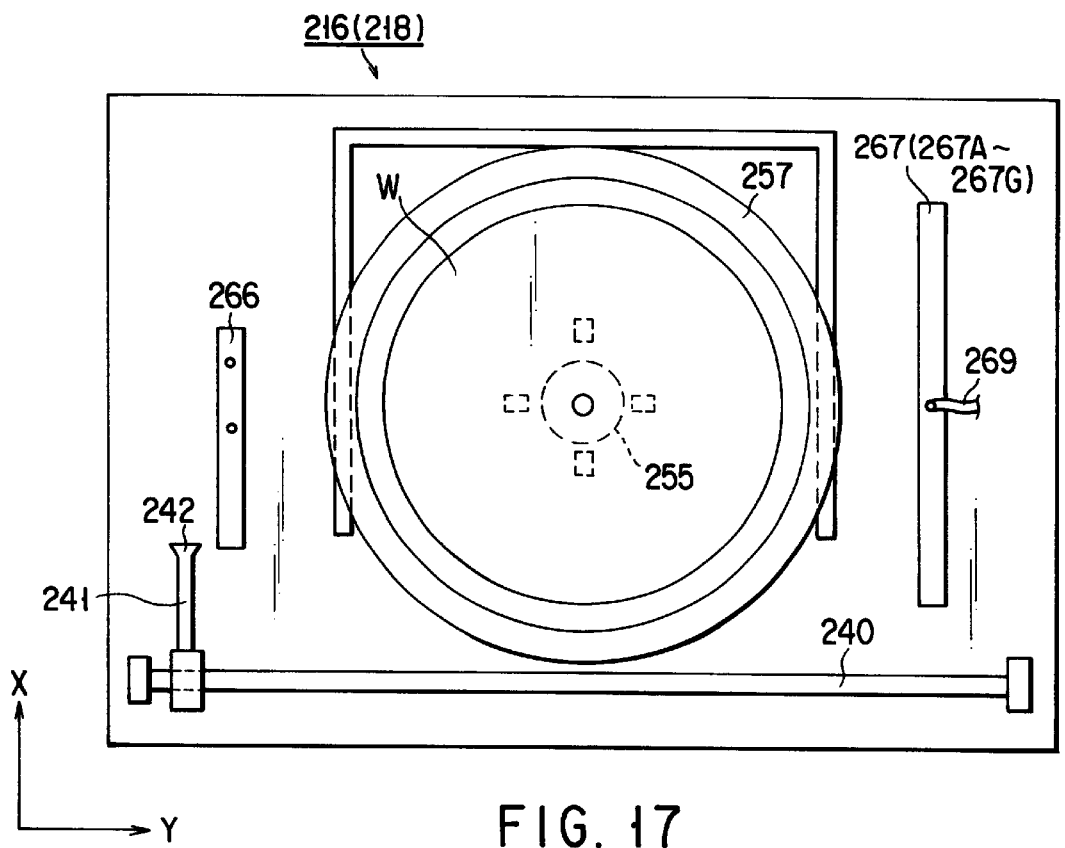
FIG. 17 is a schematic plan view showing a development unit for a semiconductor wafer.

As shown in FIG. 17, a nozzle stand-by portion is provided independently at both sides of the cup 257. A rinse solution supply nozzle 266 (not in use) is arranged at one of the nozzle stand-by portions. At the other nozzle stand-by portion, a developing liquid supply nozzle 269 (or 269A–269G) not in use is arranged.

A guide rail 240 is constructed at a back side of the development unit 216. The guide rail 240 extends along the Y-axis direction from one of side walls to the other side wall of the unit 240. A grip arm mechanism 241 is guided along the guide rail 240. The grip arm mechanism 241 has a nozzle chuck 242 at a distal end of the arm. Nozzles 266 and 267 are selectively held by the nozzle chuck 242 and transported from a nozzle stand-by position (home portion) to the upper operation position of the spin chuck 255. Such a nozzle chuck 242 is disclosed in U.S. Pat. No. 5,250,114.

The nozzle 266 communicates with a built-in tank (not shown) of a rinse solution supply unit 265. The build-in tank stores pure water as a rinse solution. The development nozzle 267 is communicated with a built-in tank (not shown) of the developing liquid supply unit 268 by way of a flow passage 269. The build-in tank stores an aqueous tetramethylammonium hydroxide solution (aqueous TMAH solution). Note that each of the rinse solution supply unit 265, the developing liquid supply unit 268, the washing solution supply unit 248, and a driving mechanism 256 is controlled by a controller 400.

Now, referring to FIGS. 19 to 29, we will explain various developing liquid supply nozzles, individually.

Figure 19:
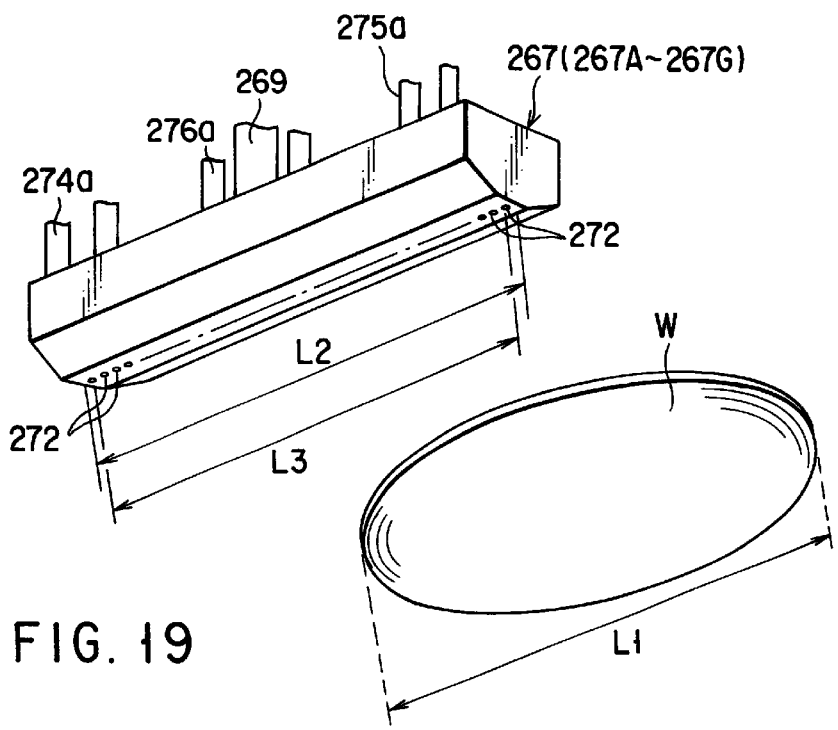
FIG. 19 are perspective views respectively showing a development nozzle and a wafer.

As shown in FIG. 19, the developing liquid supply nozzle 267 (or 267A, 267B, 267C, 267D, 267E, 267F, 267G) is linearly formed. The length L2 of the developing liquid supply nozzle is equal to or longer than a diameter L1 of the wafer W. A plurality of output holes 272 are formed in line in the lower portion of the nozzle 267. Note that the length L3 of the arrangement line of output holes 272 is nearly equal to the diameter L1 of the wafer W.

Figure 20:
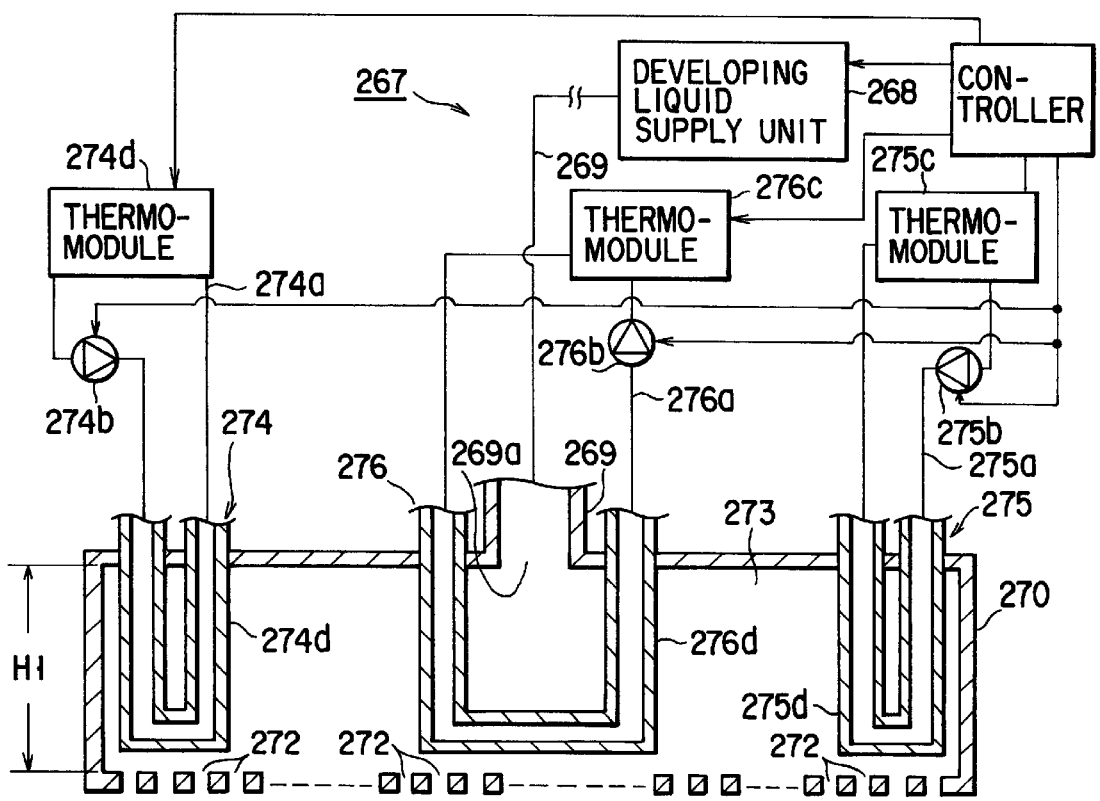
FIG. 20 is a cross-sectional view of a process liquid firm formation apparatus according to an embodiment of the present invention, with a block diagram of peripheral units.

As shown in FIG. 20, the nozzle 267 has a liquid box 270 having a header space 273 therein. At an upper center of the liquid box 270, a liquid inlet port 269a is formed. The liquid inlet port 269a communicates with the developing liquid supply unit 268 via a pipe 269.

Numerous liquid output ports 272 are punched through the bottom of the liquid box 270. These all liquid output holes 272 communicate with the header space 273. The liquid output holes 272, which have substantially the same diameter and the same shape, are arranged in line at equal intervals. The volume of the header space 273 is determined by using numerous factors including the total opening areas of the liquid output holes 272, the diameter and length of the liquid output hole 272, the diameter and number of the liquid inlet port 269a, and supply pressure of the developing liquid. For example, in the case of the development nozzle which is used when a wafer of 8 inch diameter (about 200 mm) is employed, a vertical interval H1 of the header space 273 preferably falls within the range of 10 to 30 mm. In the case of the development nozzle which is used when a wafer of 12 inch (about 300 mm) is employed, the vertical interval H1 preferably falls within the range of 20 to 50 mm.

A heat exchange portion 274d of a first heat exchange mechanism 274 is introduced into one end side of the header space 273 in a longitudinal direction. Another heat exchange portion 275d of the first heat exchange mechanism 274 is introduced into the other side of the header space 273 in the longitudinal direction. A heat exchange portion 276d of a second heat exchange mechanism 276 is introduced into the center portion of the header space 273. These first and second heat exchange mechanisms 274, 275, 276 are constructed in substantially the same manner. The first heat exchange mechanism 274 has a circulation passage 274a including a heat exchange portion 274d, a pump 274a, and a thermo-module 274c. The pump 274a and the thermo-module 274c are attached to appropriate portions of the circulation passage 274a. Water serving as a heat exchange medium is stored in the circulation passage 274a. The water is circulated through the circulation passage 274a by the pump 274b and thermo-controlled by the thermo-module 274c to an appropriate temperature. The thermo-controlled water is heat-exchanged with the developing liquid at the heat exchange portion 274d.

In the same manner, the second heat exchange mechanism 276 has a circulation passage 276a including a heat exchange portion 276d, a pump 276b, and a thermo-module 276c. The thermo-controlled water is heat-exchanged with the developing liquid at the heat exchange portion 276d.

Next, we will explain the case where the pattern-exposed resist film is developed.

The wafer W is aligned at an alignment unit 232 and processed sequentially in the adhesion unit 231 and the cooling unit 230. Then, the wafer W is transferred to a resist coating unit 215, in which a resist is coated on the wafer w to form a resist film. Subsequently, the wafer W is processed sequentially in the prebaking unit 234, the extension cooling unit 241, and the peripheral light exposure unit 251, and then pattern-exposed at the light exposure unit 204. Subsequently, the wafer W is sequentially processed in the extension unit 242 and the post-exposure baking unit 244.

The shutter is opened. The wafer w is then loaded into the development unit 216 and mounted on the spin chuck 255. The spin chuck 255 absorbs and holds the wafer W. The grip arm mechanism 271 moves the developing liquid supply nozzle 267 from the home position to the operation position to position it along the diameter of the wafer W.

Figure 21:
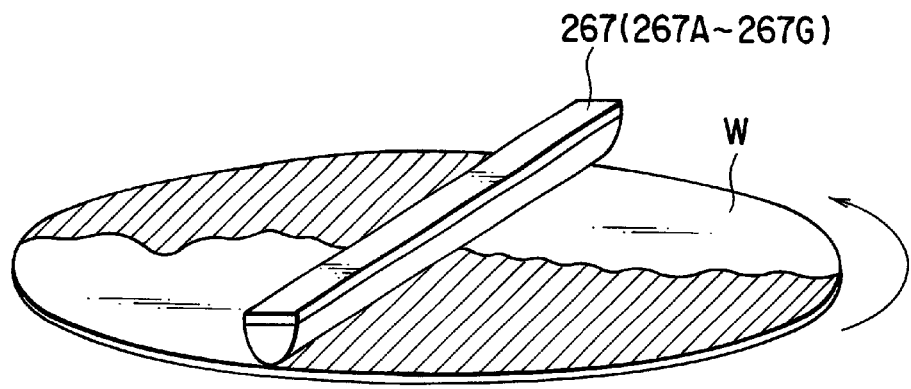
FIG. 21 is a perspective view showing a development nozzle and a wafer during processing.

Then, as shown in FIG. 21, while the wafer W is rotated at a low speed, the developing liquid is output from the nozzle 267. The developing liquid present in both end regions of the header space 273 in the longitudinal direction is thermo-controlled by the first heat exchange mechanisms 274, 275, whereas the developing liquid present in the central region of the header space 273 is thermo-controlled by the second temperature control mechanism 276. More specifically, the thermo-controlled water set at, for example, 23.5° C. by the thermo-modules 274c, 275c is allowed to flow through the heat exchange portions 274d, 275d; at the same time, the thermo-controlled water set at 23.0° C. is allowed to flow through the heat exchange portion 276d. The developing liquid around the header space 273 is controlled at 23.5° C., whereas the developing liquid at the center portion of the header space 273 is controlled at 23.0° C.

As a result, the developing liquid of 23° C. is supplied to the center region of the wafer W and the developing liquid of 23.5° C. is supplied to the peripheral region of the wafer W.

According to the apparatus of the aforementioned embodiments, the developing liquid high in temperature can be supplied to the peripheral portion of the wafer W low in temperature, whereas the developing liquid low in temperature can be supplied to the center portion of the wafer W high in temperature. It is therefore possible to develop the entire surface of the wafer W, uniformly.

Figure 22:
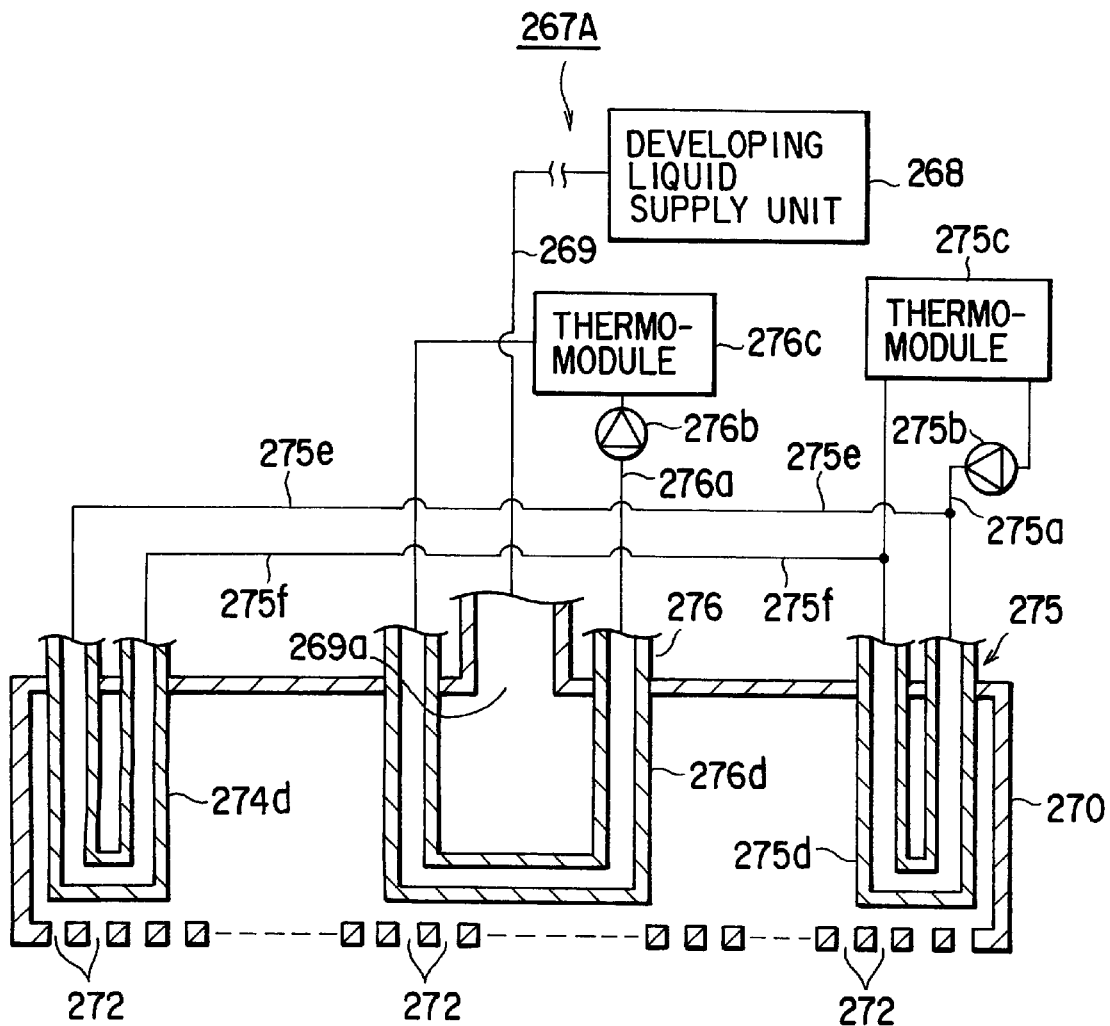
FIG. 22 is a cross sectional view of a process liquid film formation apparatus according to another embodiment of the present invention, with a block diagram of peripheral units.

As shown in the apparatus 267A of FIG. 22, branched passages 275e, 275f may be provided. The branched passages 275e, 275f are divided from a circulation passage 275a of the heat exchange mechanism 275 and allowed to communicate with both ends of the heat exchange portion 274d, respectively. The temperature of the developing liquid present in both end regions in the longitudinal direction is controlled by passing the thermo-controlled water set at the same temperature through the heat exchange portions 274d, 275d. If so, the thermo-controlled water passing through the heat exchange portion 275d may be used in the flow passage 274d.

Figure 23:
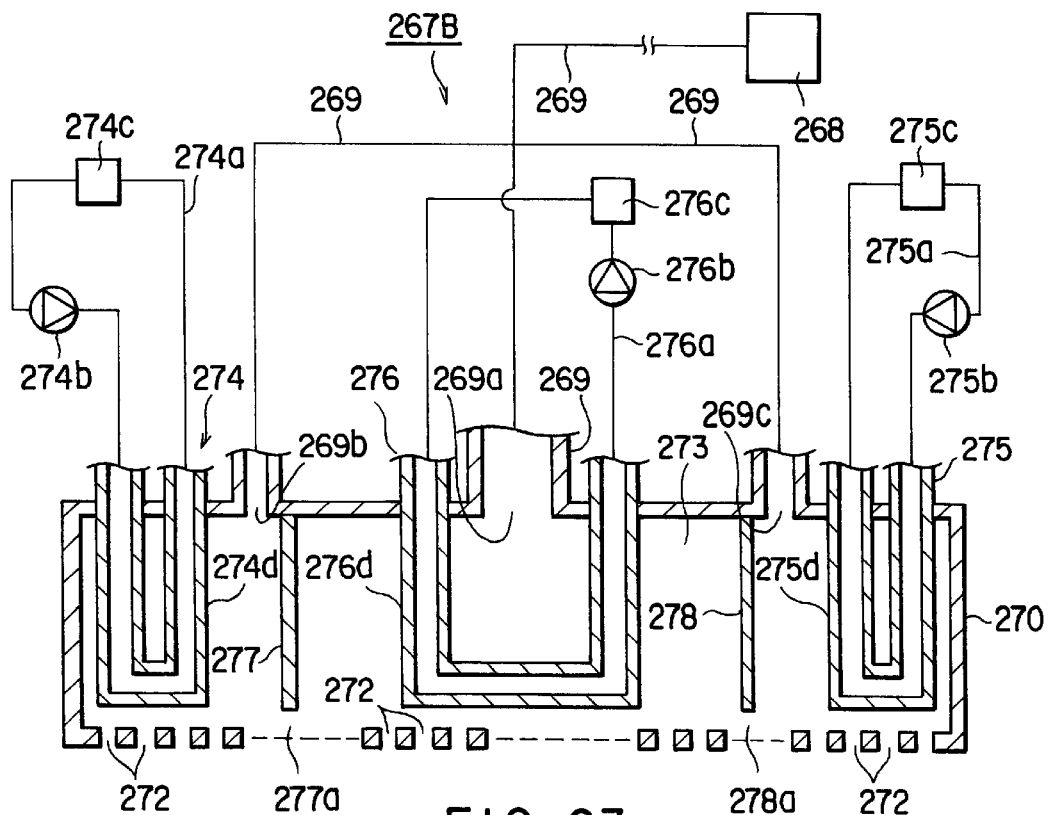
FIG. 23 is a cross sectional view of a process liquid film formation apparatus according to another embodiment of the present invention, with a block diagram of peripheral units.

As shown in the apparatus 267B of FIG. 23, partition boards 277, 278 are provided for dividing the header space 273 and the heat exchange portions 274d, 275d, 276d are respectively arranged in the regions divided by the partition boards 277, 278. In this case, communication slits 277a, 278a are formed respectively between the lower end portions of the partition boards 277, 278 and the bottom portion of the liquid box 270. The developing liquid flows through the communication slits 277a, 278a mutually between the partition regions. A liquid inlet port 269a is formed in a middle partition region. Liquid inlet ports 269b, 269c are formed respectively in the partition regions present at both sides in the longitudinal direction. The liquid inlet ports 269a, 269b, 269c are communicated with a common developing liquid supply source 268 via the branch pipe 269.

If the apparatus is constructed as described above, the amount of the developing liquid controlled by the heat exchange mechanisms 274, 275, 276 is reduced, so that the more accurately thermo-controlled developing liquid can be supplied to the wafer W. In addition, since the developing liquids different in temperature are mixed through the communication slits 277a, 278a, the temperature of the developing liquid to be output to the wafer W can be gradually changed from the center to the peripheral portion.

Figure 24:
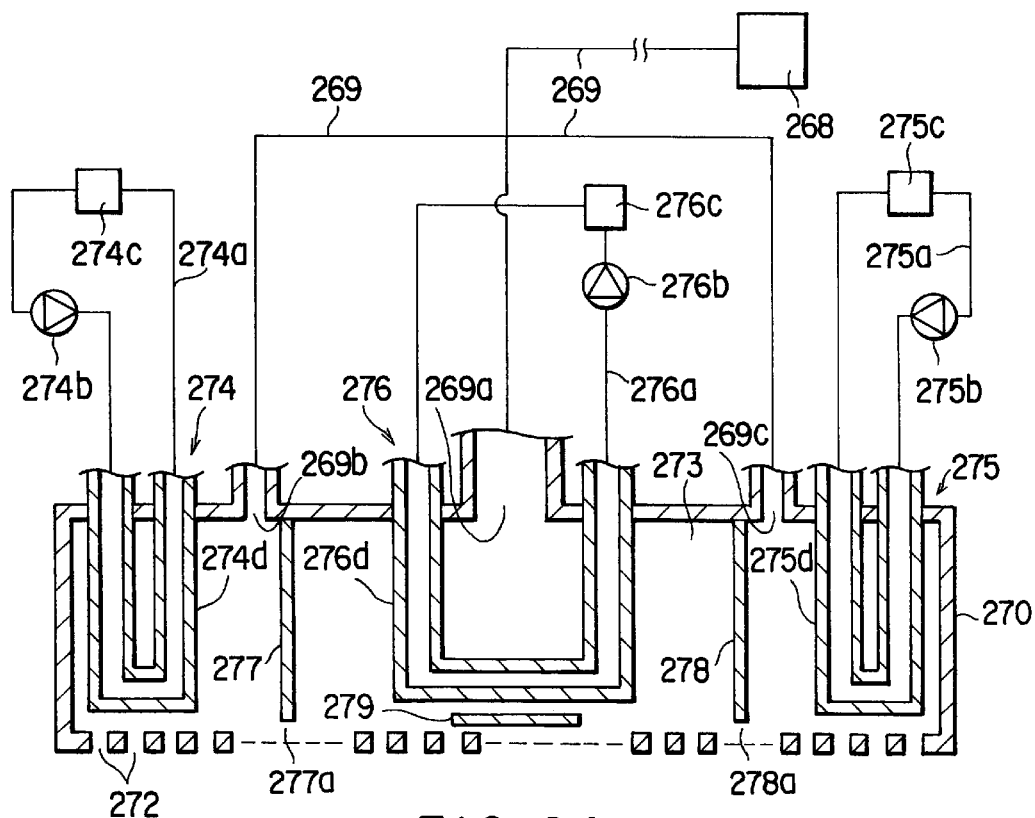
FIG. 24 is a cross sectional view of a process liquid film formation apparatus according to another embodiment of the present invention, with a block diagram of peripheral units.

AS shown in the apparatus 267c of FIG. 24, a peltier device 279 may be attached to the center portion of the header space 273. Note that the power supply circuit of the peltier device 279 is controlled by a controller 400. In such an apparatus 267C, the developing liquid present in the middle region of the header space 273 is cooled by the peltier device 279. Hence, the developing liquid can be further accurately thermo-controlled.

Figure 25:
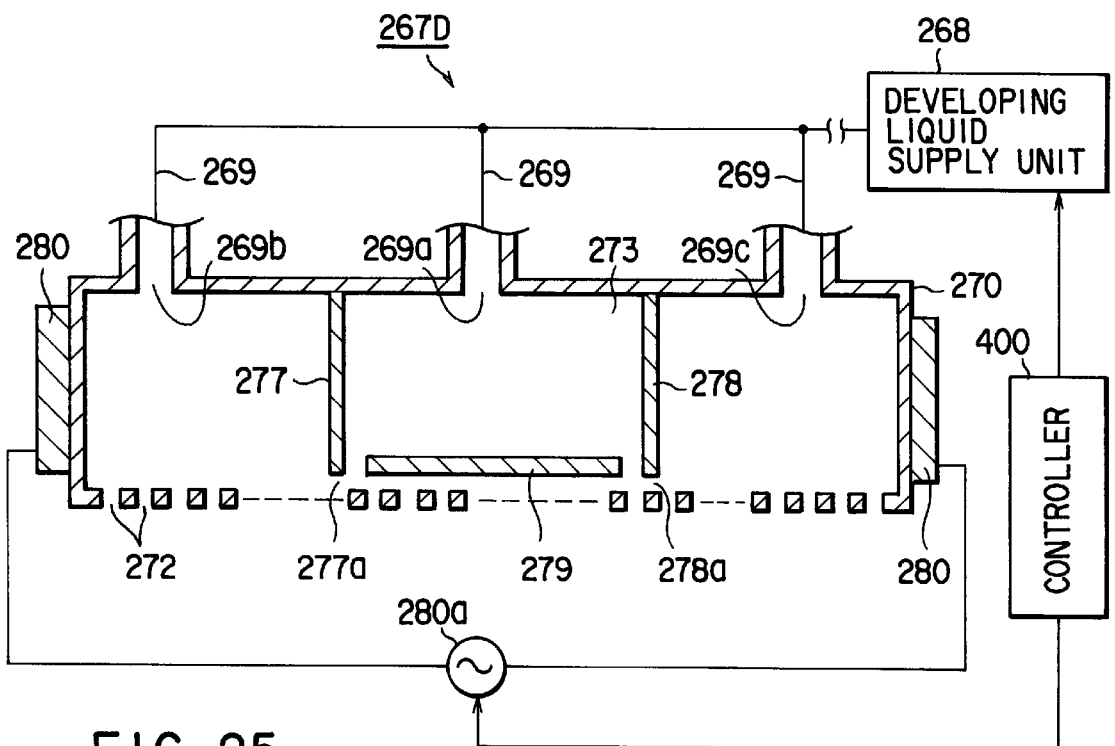
FIG. 25 is a cross sectional view of a process liquid film formation apparatus according to another embodiment of the present invention, with a block diagram of peripheral units.

As shown in the apparatus 267D of FIG. 25, heaters 280 may be attached to both side portions of the liquid box 270, respectively. The side heaters 280 share one common power source 280a, which is connected to an output side of the controller 400. If the side heaters 280 are used together with the peltier device 279, the developing liquid can be thermo-controlled further accurately. Furthermore, when the liquid box is heated by the side heaters 280, flowability (viscosity) and concentration differ between both side regions in the longitudinal direction and the middle region of the header space 273. In this manner, it is possible to correct nonuniform supply of the developing liquid to both side regions in the longitudinal direction and the middle region of the header space 273. Note that power sources may be independently connected to the side heaters to control power supply to the side heater 280.

As shown in FIG. 26, a developing liquid tank 281 may be placed between the developing liquid supply source 268 and the header space 273 to control temperature of the developing liquid within the tank 281 by the thermo-control unit (heat exchange mechanism) 282. The thermo-control unit 282 has a circulation passage 282a communicating with a jacket surrounding the developing liquid supply passage 269, a pump 282b for circulating the thermo-controlled water through the circulation passage 282a, and a thermo-module 282c for controlling the thermo-controlled water within the circulation passages 282a.

If the apparatus is constructed as mentioned above, the developing liquid which is previously thermo-controlled by the temperature controlling unit 282 of the tank 281 is further thermo-controlled by the thermo-controlling mechanisms 274, 275, 276 of the nozzle 267. Thus, the change in temperature of the developing liquid to be supplied to the nozzle 267 can be reduced, facilitating the control of the developing liquid. It is therefore possible to more accurately control the temperature of the developing liquid immediately before output to the wafer W.

Furthermore, the thermo-controlled water passed through the thermo-controlling mechanisms 274, 275, 276 may be supplied to the thermo-control unit 282 to control the temperature of the developing liquid in the developing liquid tank 281. In this manner, the thermo-controlled water used in the thermo-controlling mechanisms 274, 275, 276 may be reused in the thermo-controlling device 282. If so, efficient usage of the thermo-controlled water is attained.

Figure 27:
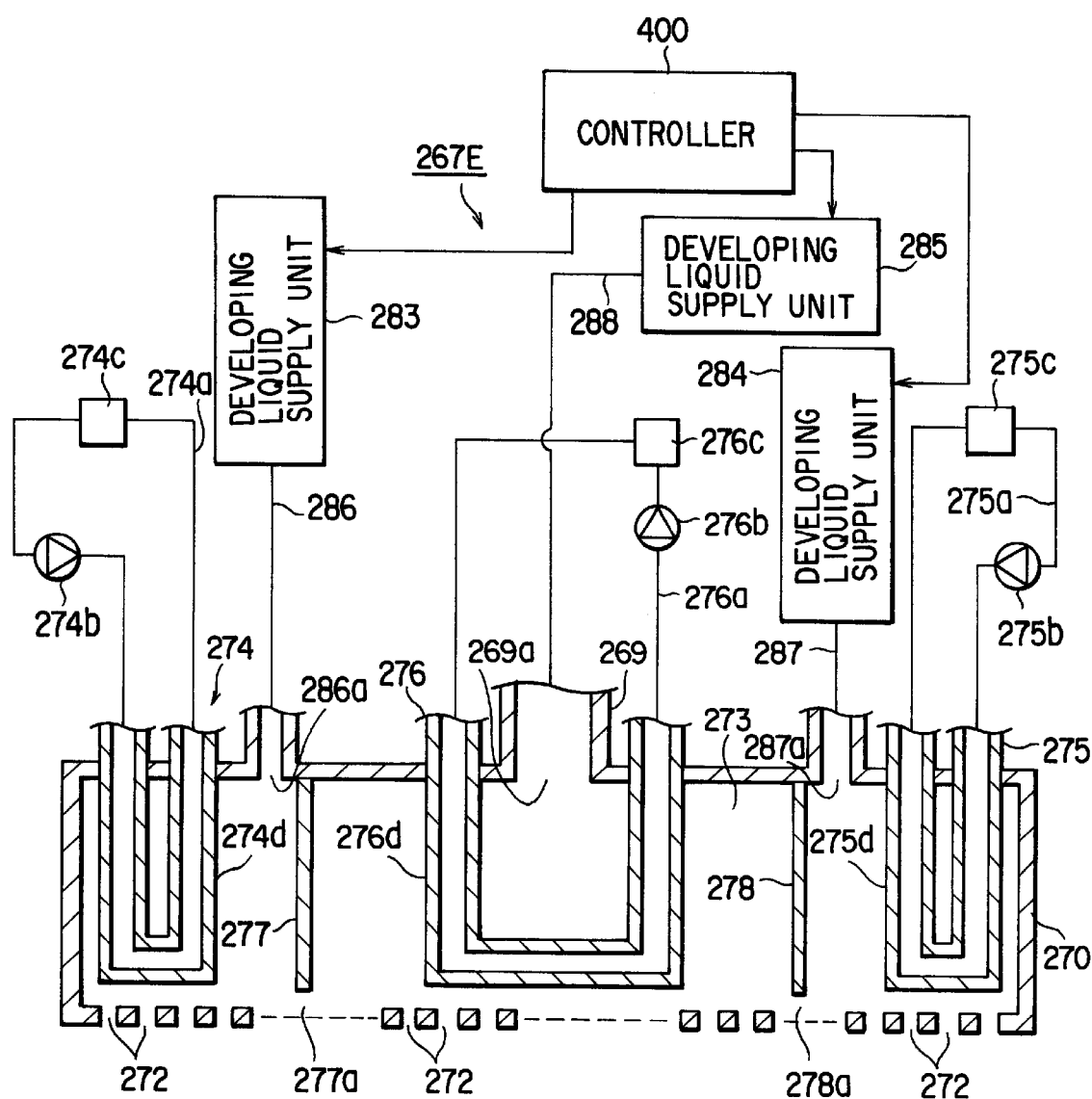
FIG. 27 is a cross sectional view of a process liquid film formation apparatus according to another embodiment of the present invention, with a block diagram of peripheral units.

As shown in the device 267E of FIG. 27, the developing liquid may be supplied to individual partition regions of the header space 273 respectively from the three developing liquid supply sources 283, 284, 285. If so, the supply amount of the developing liquid to be supplied to both regions of the header space 273 in the longitudinal direction from the developing liquid supply sources 283, 284 can be increased, whereas the supply amount of the developing liquid to be supplied to the middle region of the header space 273 from the developing liquid supply source 285, can be reduced. In this manner, the developing liquid is supplied to the center region of the wafer W in the same amount as that to the peripheral region per unit area. The development solution film can be formed uniformly on the wafer W. Note that, the header space 278 may be completely partitioned by the partition boards 277, 278 without forming communication slits 277a, 278a.

Figure 28:
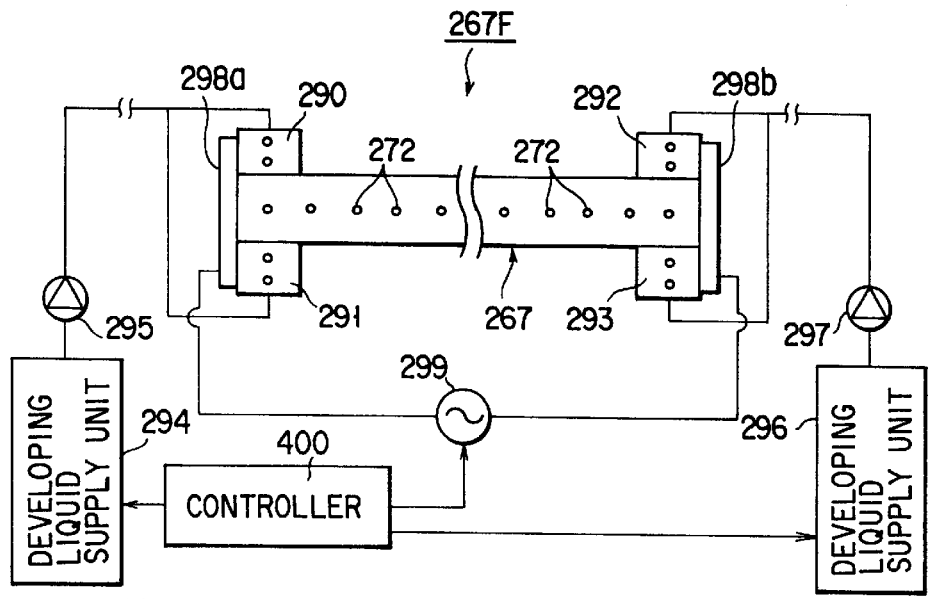
FIG. 28 is a cross sectional view of a process liquid film formation apparatus according to another embodiment of the present invention, with a block diagram of peripheral units.

As shown in the apparatus 267F of FIG. 28, sub nozzles 290, 292 and 292, 293 are formed respectively at both ends of the lower surface of the developing nozzle 267. The developing liquid is sent by a pump 295 to the sub nozzles 290, 291 arranged at one side from the supply unit 294, whereas, the developing liquid is sent by another pump 297 from a supply unit 296 to the sub-nozzles 292, 293 arranged at the other side.

Furthermore, a side heater 298a is attached to the side surface of the sub nozzles 290, 291. Another side heater 298b is attached to the side surface of the sub nozzles 292, 293. The side heaters 298a, 298b use a common power source 299, which is further connected to an output side of the controller 400. Note that power sources are connected respectively to the heater 298a, 298b to thereby individually control power supply to the heater 298a and 298b.

If the apparatus is constructed as described above, the supply amount of the developing liquid to the peripheral portion of the wafer W from the peripheral portion of the header space 273 can be increased compared to the center portion. In the case of the apparatus 267F, a developing liquid film can be formed uniformly on the wafer in the same as in the case of the apparatus 267E of FIG. 27.

After the supply of the developing liquid is completed, the rotation of the water w is stopped for a predetermined time to develop a latent image pattern formed in a resist film. After the development, the wafer W is rotated at a high speed to remove the developing liquid form the wafer W. The development surface is rinsed while pure water supplied from the rinse nozzle 266 is poured to the wafer W. Then, the wafer W is rotated at a high speed to dry the wafer W.

Thereafter, the wafer W is sequentially transferred to the post-baking unit 246, the cooling unit 230, and the extension unit 233 to apply predetermined treatments to the wafer. The wafer W is then taken out from the extension unit 233 by the sub transfer-arm mechanism 208 and stored in a cassette C for storing processed wafers. In this way, a series of resist coating/developing processes is completed.

Figure 29:
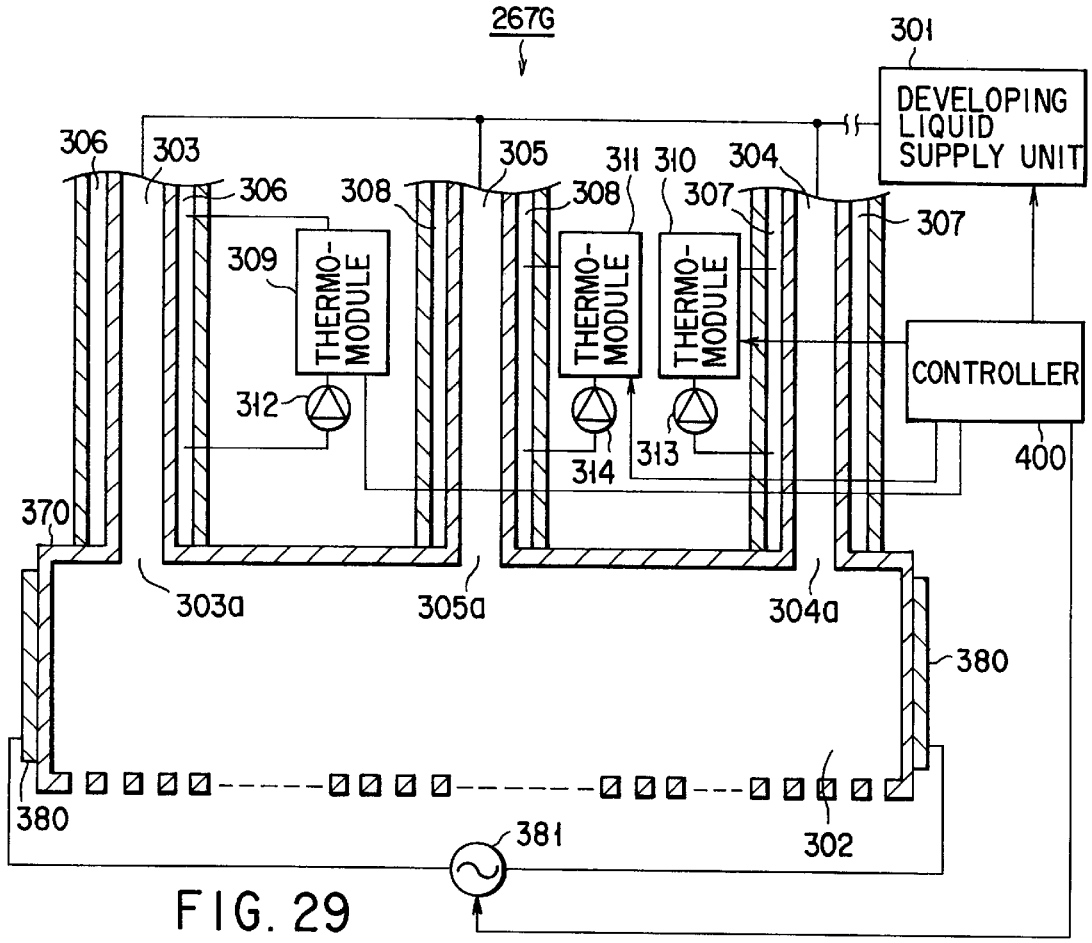
FIG. 29 is a cross sectional view of a process liquid film formation apparatus according to another embodiment of the present invention, with a block diagram of peripheral units.

Then, referring to FIG. 29, another development nozzle 267G will be explained.

The development nozzle 267G has a liquid box 370. A header space 302 is defined by the liquid box 370. The header space 302 communicates with a developing liquid supply unit 301 by way of three supply pipes 303, 304, 305. Of three pipes, one end of the supply pipe 305 is attached to an upper center portion of the nozzle box 370 and communicated with the header space 302 through the upper center portion.

The developing liquid supply pipes 303, 304 communicate with the developing liquid supply source 301 and simultaneously communicate with both regions of the header space 302 in the longitudinal direction. The developing liquid supply pipe 305 communicates with the developing liquid supply source 301 and simultaneously communicates with the central region of the header space 302. Furthermore, the developing liquid supply circuit has flow passages 306, 307, 308, which respectively cover the peripheral portions of the developing liquid supply pipes 303, 304, 305 which are divided from the development solution supply source 301, thermo-modules 309, 310, 311 which control the thermo-controlled water flowing through the flow passages 306, 307, 308 at predetermined temperatures, and pumps 312, 313, 314 circulating the thermo-controlled water through the flow passages 306, 307, 308, respectively. Note that the developing liquid supply pipes 303, 304, 305 communicate with the header space 302 through liquid inlet ports 303a, 304a, 305a.

The temperatures of the thermo-controlled water flows passing through the flow passages 306, 307 are controlled respectively by the thermo-module 309, 310 at, for example, 23.5° C. The temperature of the thermo-controlled water passing through the flow passage 308 is controlled by the thermo-module 311 at, for example, 23.0° C.

In the development nozzle 267G, the developing liquid of 23.5° C. is supplied to the peripheral portion of the wafer W from the vicinity of the both ends of the header space 302, whereas the developing liquid of 23.0° C. is supplied from the middle portion of the header space to the center portion of the wafer W.

In this case, the same thermo-controlled water may be supplied through the flow passages 306, 307. For example, if the thermo-controlled water passing through the flow passage 306 is introduced into the flow passage 307 by the pump 309, the thermo-module 310 and the pump 313 are not required, so that the structure of the development apparatus 300 can be more simplified.

The developing liquid tank 281 (see FIG. 26) is attached to each of the developing liquid supply pipes 303, 304, 305. The developing liquid of the developing liquid tank 281 is thermo-controlled by the thermo-control unit 82 and each of the thermo-controlled water flows passed through the passages 306, 307, 308 may be reused in the thermo-controlled unit 82.

Furthermore, a side heater 380 is arranged at both side portions of the liquid box 370. The developing liquid present in both side regions of the header space 302 may be heated. Note that two side heaters 380 share a common power source 381 which is connected to an output side of the controller 400.

Note that four or more thermo-control mechanisms (heat exchange mechanisms) may be provided in the header space 273. Furthermore, the header space 273 may be partitioned into four regions or more. The thermo-controlled water is taken as an example of a fluid. However, the thermo-controlled gas may be used in the present invention. Alternatively, a plurality of developing liquid tanks 281 are arranged in parallel within the storage box 219 and the developing liquid tanks 281 are used by switching from each other. In addition, a development apparatus is explained as an example of the substrate processing apparatus. However, the present invention is applicable to other substrate processing apparatus including a resist coating apparatus. The substrate is not limited to the wafer W. For example, an LCD substrate may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for forming a film of a process liquid, comprising:

a mounting table for supporting the substrate to be processed substantially horizontally;

process liquid supply means for supplying a process liquid for processing the substrate;

a linear nozzle having a header space which has a length substantially corresponding to a diameter of the substrate, and a liquid discharge portion, the header space mutually communicating with the liquid discharge portion;

a liquid inlet port which communicates with the process liquid supply means and whose opening is formed above the header space;

moving means for relatively moving the linear nozzle and the mounting table while the liquid discharge portion faces the substrate on the mounting table; and viscosity control means for controlling a viscosity of the process liquid in the vicinity of the liquid discharge portion.

2. An apparatus according to claim 1, wherein the viscosity control means is a heater for directly and indirectly heating the process liquid present in both side regions of the header space in a longitudinal direction.

3. An apparatus according to claim 1, wherein the viscosity control means is arranged at both sides in a longitudinal direction of at least one of the header space and the liquid discharge portion.

4. An apparatus according to claim 1, wherein the viscosity control means is a heater for heating the process liquid present extending from a position remote from the linear nozzle to both side regions of the header space in the longitudinal direction.

5. An apparatus according to claim 1, wherein the viscosity control means comprises a first heat exchange mechanism for exchanging heat with the process liquid present in both side regions of the header space in the longitudinal direction;

a second heat exchange mechanism for exchanging heat with the process liquid present in a middle region of the header space in the longitudinal direction; and a controller for controlling the first and second heat exchange mechanisms, independently.

6. An apparatus according to claim 1, wherein the liquid discharge portion has a plurality of minute holes each communicating with the header space and formed through a lower portion of the linear nozzle.

7. An apparatus according to claim 1, further comprising a controller for controlling the process liquid supply means and the moving means.

8. An apparatus according to claim 7, wherein the controller causes a difference in amount between the process liquid supplied to a substrate through said both side regions of the header space in the longitudinal direction and an amount of the process liquid supplied to the substrate through the middle region of the header space.

9. An apparatus according to claim 5, wherein each of the first and second heat exchange mechanisms has a heat exchange portion, which is introduced in the header space, a circulation passage for circulating a medium responsible for heat exchange with the process liquid, and a thermo-module for controlling temperature of the heat exchange medium within the circulation passage.

10. An apparatus according to claim 9, further comprising at least one partition board which divides the header space into a plurality of regions, in each of which a heat exchange portion is arranged.

11. An apparatus according to claim 9, wherein the process liquid supply means further comprises a process liquid reservoir tank for storing the process liquid and a thermo-control unit for controlling temperature of the process liquid stored in the process liquid reservoir tank.

12. An apparatus according to claim 9, further comprising cooling means for cooling the process liquid present in the middle region of the header space.

13. An apparatus according to claim 11, wherein each of the first and second heat exchange mechanism communicates with the thermo-control unit.

14. An apparatus according to claim 1, further comprising a nozzle stand-by portion in which the linear nozzle is placed in a stand-by motion when not in use.

15. An apparatus according to claim 1, further comprising film thickness control mean ranged at both end sides of the liquid discharge portion in the longitudinal direction, for controlling output pressure of the process liquid output from both end regions of the liquid discharge portion in the longitudinal direction at a value smaller than the output pressure of the process liquid output from the center of the liquid discharge portion.

16. An apparatus according to claim 1, wherein the process liquid is a photoresist solution to be coated on the substrate.

17. An apparatus according to claim 2, wherein the heater heats the process liquid supplied onto the substrate from the linear nozzle.

18. An apparatus according to claim 2, wherein
the heating means is a heater attached to an exterior side of the liquid discharge portion of the linear nozzle; and
the controller moves the linear nozzle by the moving means such that the heater is located downstream of the liquid discharge portion.

19. An apparatus according to claim 18, further comprising an insulating spacer provided between the heater and the liquid discharge portion, for inhibiting heat transmission from the heater to the process liquid within the linear nozzle.

20. An apparatus for forming a film of a process liquid, comprising:
a mounting table for supporting a substrate to be processed substantially horizontally;
a linear nozzle having a header space which has a length substantially corresponding to a diameter of the substrate, and a liquid discharge portion, the header space mutually communicating with the liquid discharge portion;
process liquid supply means having a supply passage which communicates the header space of the linear nozzle and supplies a process liquid for processing the substrate to the header space;
a liquid inlet port which communicates with the process liquid supply means and whose opening is formed above the header space;
moving means for relatively moving the linear nozzle and the mounting table while the liquid discharge portion faces the substrate on the mounting table; and
temperature control means for controlling a temperature of the process liquid passing through the supply passage.

21. An apparatus according to claim 20, wherein the process liquid supply means has a plurality of supply passages and at least one process liquid supply source communicating with the header space by way of said plurality of supply passages, and
the temperature control means has a plurality of temperature control mechanisms for controlling temperature of the process liquid passing through said plurality of supply passages, independently.

22. An apparatus according to claim 21, wherein the process liquid supply means has a plurality of process liquid supply sources; and
said plurality of supply passages communicate with said plurality of process liquid supply sources corresponding thereto.

23. An apparatus according to claim 21, wherein the process liquid supply means has one of the process liquid supply sources, and
each of said plurality of supply passages communicates with said one of the process liquid supply sources.

24. An apparatus according to claim 20, further comprising a controller for controlling the temperature control means.

25. An apparatus for forming a film of a process liquid, comprising:
a mounting table for supporting the substrate to be processed substantially horizontally;
process liquid supply means for supplying a process liquid for processing the substrate;
a linear nozzle having a header space which has a length substantially corresponding to a diameter of the substrate, and a liquid discharge portion, the header space mutually communicating with the liquid discharge portion;
a liquid inlet port which communicates with the process liquid supply means and whose opening is formed above the header space;
moving means for relatively moving the linear nozzle and the mounting table while the liquid discharge portion faces the substrate on the mounting table; and
temperature control means for controlling temperature of the process liquid in the vicinity of the liquid discharge portion.

26. An apparatus according to claim 25, the concentration control means is a heater for directly and indirectly heating the process liquid present in both side regions of the header space in a longitudinal direction.

27. An apparatus according to claim 25, wherein the temperature control means is provided at both end regions in a longitudinal direction of at least one of the header space and the liquid discharge portion.

28. An apparatus according to claim 25, wherein the temperature control means is a heater for heating the process liquid present from a position remote from the linear nozzle to both side regions of the header space in the longitudinal direction.

29. An apparatus according to claim 25, wherein temperature control means comprises a first heat exchange mechanism for exchanging heat with the process liquid present in both side regions of the header space in the longitudinal direction;

a second heat exchange mechanism for exchanging heat with the process liquid present in a center region of the header space in the longitudinal direction; and a controller for controlling the first and second heat exchange mechanisms, independently.

30. An apparatus according to claim 25, wherein the liquid discharge portion has a plurality of minute holes each communicating with the header space and formed in a lower portion of the linear nozzle.

31. An apparatus according to claim 25, further comprising a controller for controlling the process liquid supply means and the moving means, independently.

32. An apparatus according to claim 31, wherein the controller controls the process liquid supply means to cause a difference in amount between the process liquid supplied to a substrate through both side regions of the header space in the longitudinal direction and the process liquid supplied to the substrate through a middle region of the header space.

33. An apparatus according to claim 29, wherein each of the first and second heat exchange mechanisms has a heat exchange portion, which is introduced in the header space, a circulation passage for circulating a medium responsible for heat exchange with the process liquid, and a thermo-module for controlling temperature of the heat exchange medium within the circulation passage.

34. An apparatus according to claim 33, further comprising at least one partition board which divides the header space into a plurality of regions, in each of which the heat exchange portion is arranged.

35. An apparatus according to claim 33, further comprising a process liquid reservoir tank interposed between the process liquid supply means and the linear nozzle, and a thermo-control unit for controlling temperature of the process liquid stored in the process liquid reservoir tank.

36. An apparatus according to claim 35, wherein each of the first and second heat exchange mechanism communicates with the thermo-control unit.

37. An apparatus according to claim 25, further comprising a nozzle stand-by portion in which the linear nozzle is placed in a stand-by motion when not in use.

38. An apparatus according to claim 25, further comprising film thickness control means arranged at both end sides of the liquid discharge portion in the longitudinal direction, for controlling discharge pressure of the process liquid discharge from both end regions of the liquid discharge portion in the longitudinal direction at a value smaller than the discharge pressure of the process liquid discharge from the center portion of the liquid discharge portion.

39. An apparatus according to claim 25, wherein the process liquid is a developing liquid for developing a latent pattern formed in a photoresist film formed on the substrate.

40. An apparatus according to claim 26, wherein the heater heats the process liquid supplied on the substrate from the linear nozzle.

41. An apparatus according to claim 26, wherein the heating means is a heater attached to an external side of the liquid discharge portion of the linear nozzle;

the controller moves the linear nozzle by the moving means such that the heater is located downstream of the liquid discharge portion.

42. An apparatus according to claim 41, further comprising an insulating spacer provided between the heater and the liquid discharge portion, for inhibiting heat transmission from the heater to the process liquid within the linear nozzle.

\* \* \* \* \*